(12) United States Patent
Doche

(10) Patent No.: US 6,273,664 B1
(45) Date of Patent: Aug. 14, 2001

(54) COUPLING SYSTEM FOR THE TRANSFER OF A CONFINED PLANAR OBJECT FROM A CONTAINMENT POD TO AN OBJECT PROCESSING UNIT

(75) Inventor: Claude Doche, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/155,784

(22) PCT Filed: Apr. 2, 1997

(86) PCT No.: PCT/FR97/00588

§ 371 Date: Apr. 12, 1999

§ 102(e) Date: Apr. 12, 1999

(87) PCT Pub. No.: WO97/38440

PCT Pub. Date: Oct. 16, 1997

(30) Foreign Application Priority Data

Apr. 3, 1996 (FR) .................................................. 96 04170

(51) Int. Cl.[7] .................................................. B65G 49/07
(52) U.S. Cl. ...................... 414/217; 118/719; 414/217.1; 414/939; 414/684.3
(58) Field of Search .............................. 414/222.01, 217, 414/217.1, 416, 935, 937, 939, 941, 684.3; 118/719

(56) References Cited

U.S. PATENT DOCUMENTS

| | | | | |
|---|---|---|---|---|
| 5,590,994 | * | 1/1997 | Schertler | 414/217 |
| 5,961,269 | * | 10/1999 | Kroeker | 414/217 X |
| 6,071,059 | * | 6/2000 | Mages et al. | 414/411 |

FOREIGN PATENT DOCUMENTS

| | | |
|---|---|---|
| 0 582 018 A1 | 2/1994 | (EP) . |
| 0 589 812 A1 | 3/1994 | (EP) . |
| 2 697 000 | 4/1994 | (FR) . |
| 2 249 145 A | 4/1992 | (GB) . |

OTHER PUBLICATIONS

Patent Abstracts of Japan, vol. 7, No. 178 (E–191) [1323], Apr. 6, 1983, and JP 58 084439 A (Hitachi), May 20, 1983.

* cited by examiner

Primary Examiner—Frank E. Werner
(74) Attorney, Agent, or Firm—Anderson, Kill & Olick, P.C.

(57) ABSTRACT

A coupling system for the transfer of a flat object from a confinement box towards a processing unit for processing the flat object. The coupling system includes a first shutter, at least one second opening, a second shutter, and a third shutter associated with the second opening on a side facing the processing unit, and devices for releasing the first, second and third shutter, after coupling the transfer opening of the confinement box with the transfer opening of the processing unit, in order to allow the transfer of the object between the confinement box and the processing unit.

18 Claims, 17 Drawing Sheets

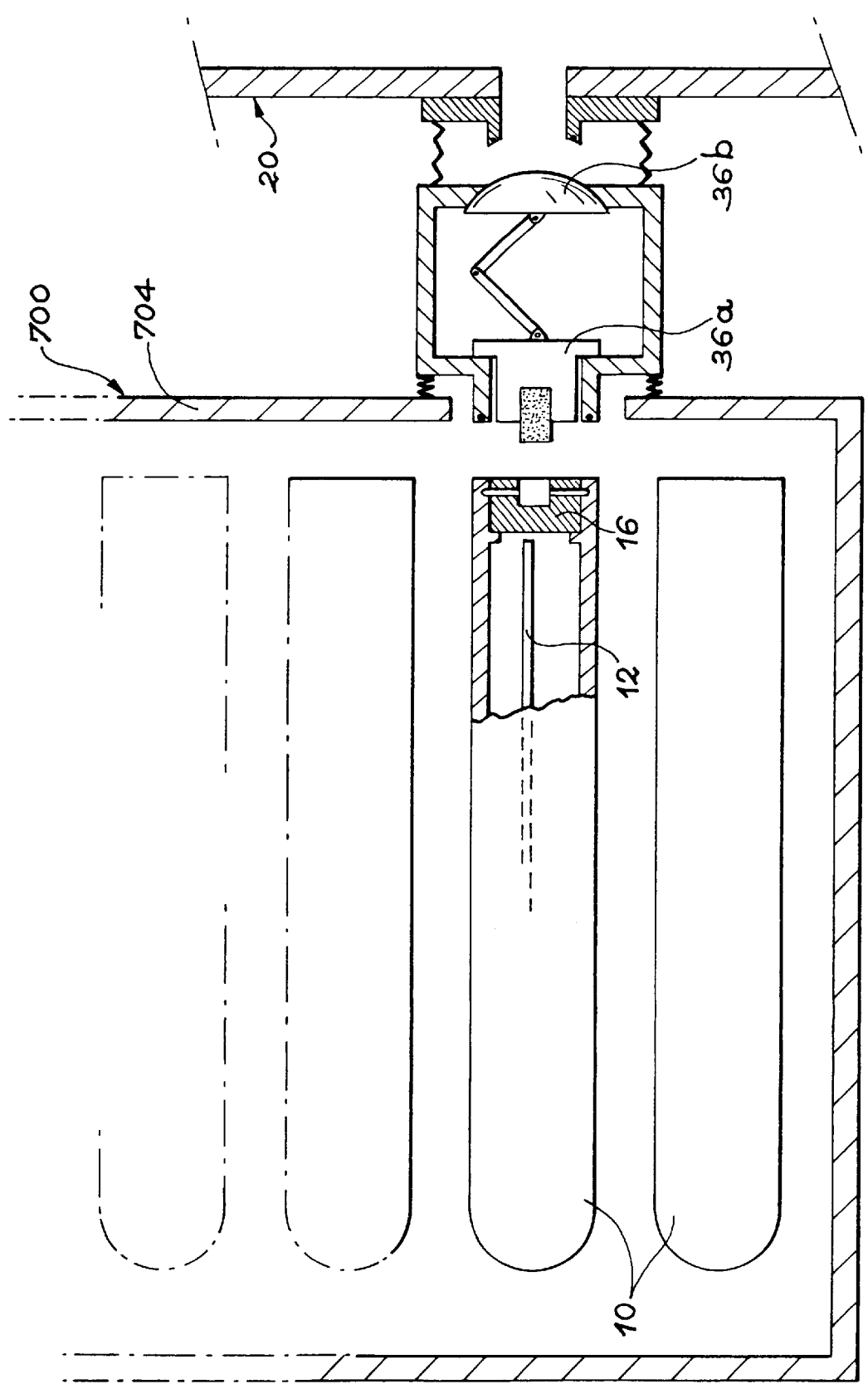

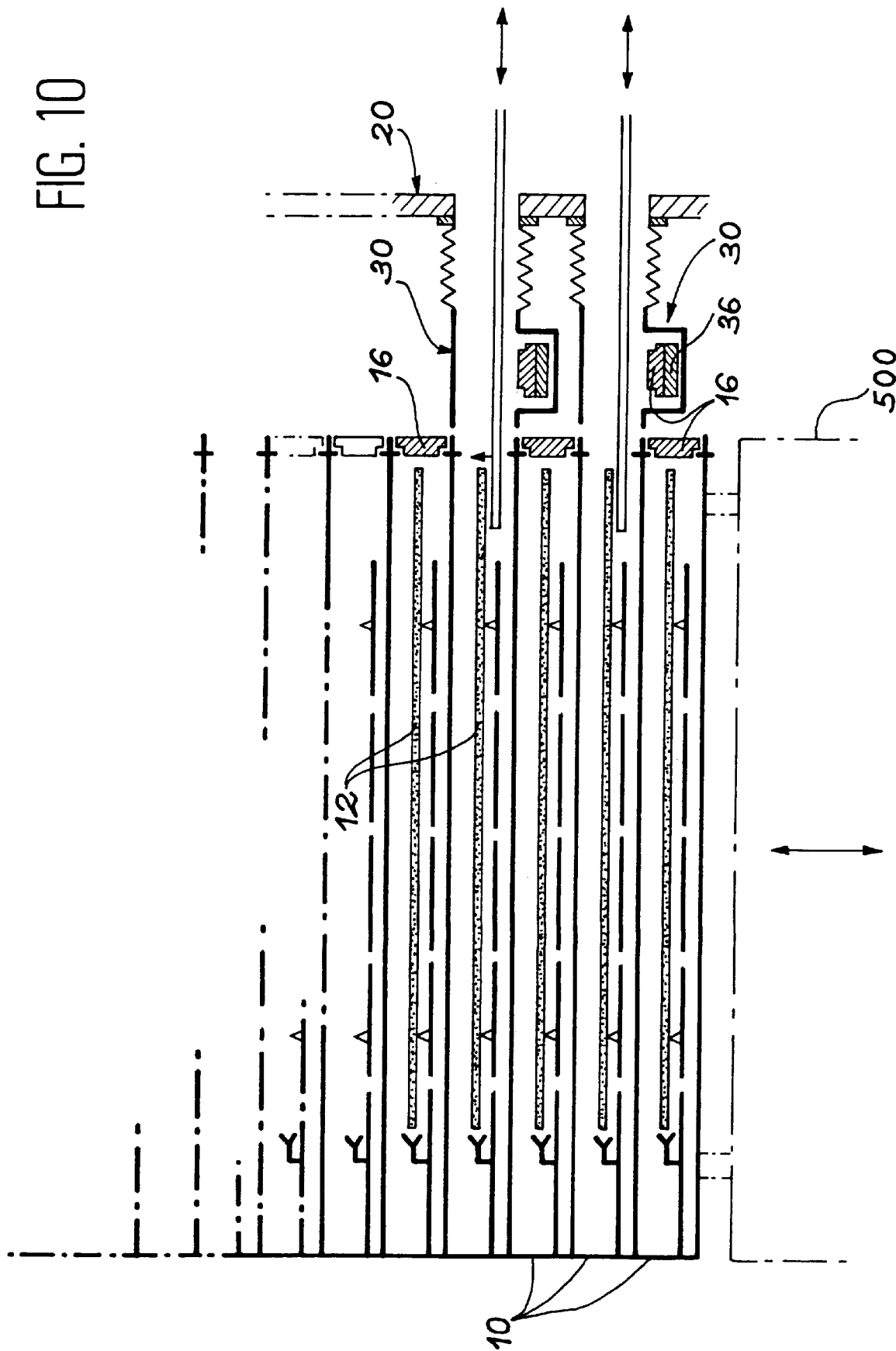

Figure 1A:
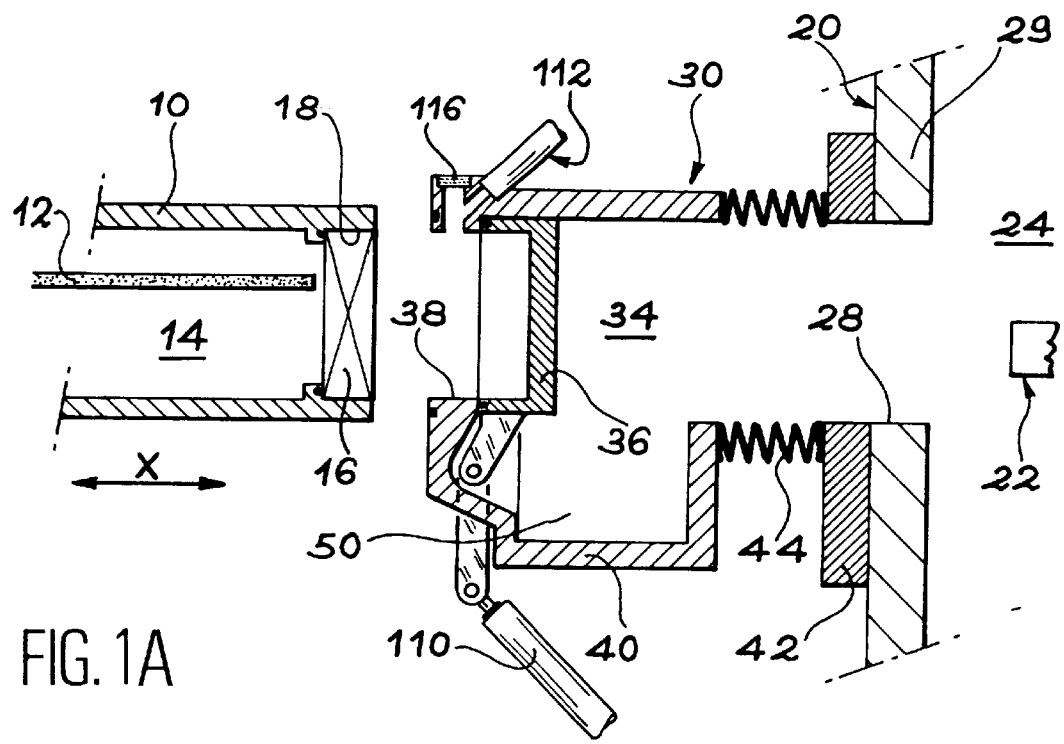

COUPLING SYSTEM FOR THE TRANSFER OF A CONFINED PLANAR OBJECT FROM A CONTAINMENT POD TO AN OBJECT PROCESSING UNIT

TECHNICAL FIELD

The present invention relates to a coupling system for confined transfer of a flat object from a confinement box towards a processing unit for the object.

Said system may be used in particular for the transfer of silicon wafers placed individually in confinement boxes under controlled atmosphere, towards reactors such as chemical vapour deposition reactors or etching reactors, or plasma activated deposition reactors for example.

By confined box under controlled atmosphere is meant a box whose inner medium has a determined composition, cleanliness, purity and/or pressure.

START OF THE PRIOR ART

The transfer of flat objects, in particular of silicon wafers, is generally conducted in a clean room directly from a stepped basket containing the flat objects towards the processing unit.

The costs and technical difficulties connected with fitting out clean rooms of large volume that come under a high cleanliness category, have however led to the use of confined receptacles of small size able to contain the objects for which a clean environment is required.

These confined receptacles, described in detail below, also have the advantage of being able to maintain a pure atmosphere around the objects. By pure atmosphere is meant an atmosphere which does not contain any chemical contaminant products. It may, for example, be a nitrogen $N_2$ or rare gas atmosphere, such as argon for example.

Hereinafter a distinction is made between a pure atmosphere such as defined here, and a clean atmosphere which is characterized by a reduced number of particle contaminate elements ($\leq 0.3$ mm) per volume unit.

A first type of confined receptacle is designated by the acronym SMIF (Standardized Mechanical Interface). It is a box with a bell-shaped lid resting on a base tray. Sealed adjustment is provided between the lid and the base tray. These boxes also contain a basket in which semiconductor wafers are stacked.

These confined receptacles are used to move the wafers from their place of manufacture towards a processing unit, or from a processing unit towards a further processing unit, while keeping them in a confined atmosphere, that is clean and pure, such as defined above.

A detailed description of SMIF interfaces can be found in documents (1) and (2) whose references are given at the end of this disclosure.

To transfer the wafers from SMIF interfaces towards a processing unit, a transfer airlock equipped with an unloading robot is provided at the head of the processing unit. Such airlock, in which a clean and possibly pure atmosphere must be maintained, is indispensable in order to avoid contamination of the flat objects when they are removed from the confined receptacle. The transfer airlock is also called "mini-environment", "enclosure", or "canopy". The basket and wafer unit it contains is removed from the confined receptacle inside the airlock, and the wafers are subsequently removed one by one from the basket and placed in the processing unit.

SMIF interfaces have a certain number of disadvantages however. Among the latter, mention may be made of the fact that they cannot prevent mutual pollution of the silicon wafers stored inside. Also, on account of their fixed capacity, approximately 25 wafers, these interfaces are not adapted to flexible use for just-in-time production.

Given these problems, other confinement receptacles have been designed in the form of individual boxes. Such boxes are described in documents (1) and (2) but also in document (3) whose reference is also given at the end of this disclosure. These boxes have a side opening for inserting and removing the wafers. They are closed in sealed manner by a pivoting door. To transfer the semiconductor wafers towards a processing unit, the individual boxes, like the SMIF interfaces, are placed in an airlock positioned in front of an in/out opening of the processing unit. The in/out opening of the processing unit is also closed by a door. An example of individual box and an opening system for its door is also described in document (4) whose reference is given at the end of this disclosure.

When an individual confinement box is in position, inside the airlock, in front of the opening of the processing unit, the doors of the box and processing unit may be opened to transfer the wafer.

The airlock, positioned at the entrance to the processing units, is a complex set of equipment in which a clean atmosphere must be maintained.

Also, the transfer airlock must be fitted with a transfer robot to withdraw the flat objects to be processed from their confinement box. Said equipment is shown in the figures of document (2) for example.

Additional difficulties arise when the wafers or flat objects must be maintained in a pure or inert atmosphere, for example a nitrogen atmosphere. These difficulties are, for example, connected with the need to frequently drain the airlock whose inside volume is generally fairly considerable, on account of the presence of the transfer robot in particular. An example of flat object transfer in a clean atmosphere is described in document (5) whose reference is also given at the end of this disclosure.

Also, the confinement receptacles and the airlocks of the processing units do not generally enable transfer of the wafers in a vacuum.

Therefore, one purpose of the present invention is to make available a coupling system for the confined transfer of a flat object from a confinement box towards a processing unit, which does not have the restrictions and disadvantages described above.

A further purpose of the invention is to propose said system with which it is possible to achieve transfer without causing a break in the clean atmosphere surrounding the objects.

Another purpose is also to set forth a system allowing transfer in a pure atmosphere.

Another purpose is to propose a system allowing the vacuum transfer of flat objects.

A further purpose of the invention is to propose a system which does not require its own transfer robot, but with which it is possible to make direct use of a robot already fitted to the processing unit in order to remove the flat objects from the confinement boxes.

A further purpose is to propose a simple system, less costly than the airlock systems, which requires little space.

Another purpose, finally, is to propose a system without an airlock, which remains compatible with the direct transfer of flat objects from a tiered basket such as described at the start of this disclosure.

DESCRIPTION OF THE DISCLOSURE

In order to reach the above-mentioned purposes, the object of the invention is more precisely a coupling system for the confined transfer of a flat object from a confinement box having a first side opening for the transfer of the flat object, and a first shutter, towards a unit for processing the flat object having at least a second opening for the transfer of the flat object.

In accordance with the invention, the system comprises:
- means for the sealed coupling of the confinement box opening with the opening of the processing unit, these means having a second shutter, and
- means of releasing the first and second shutters, after coupling the confinement box opening with the opening of the processing unit.

The transfer of the flat object from the confinement box towards the processing unit takes places via the sealed coupling means and is conducted by a mechanism for moving the flat object. Said mechanism exists on processing units in the form of a robot handling flat objects.

With the coupling means and the means for releasing the first and second openings, after coupling, it is possible to place in contact the inner spaces of the confinement box and the processing unit.

The coupling is impervious to the surrounding medium. The cleanliness and purity of the atmosphere in the box and inside the processing unit are therefore preserved.

Therefore, the system can operate in an environment other than that of a clean room without the need for a transfer airlock. Moreover, as indicated above, since no transfer airlock is required, it is possible to make direct use of the manipulator robot of the processing unit in order to transfer the flat objects.

The coupling system in the sense of the present invention is understood as a set of means or mechanisms of which some are part of the confinement box, and others are fixed to the processing unit.

The following description is given with reference to a single confinement box containing one single flat object to be transferred. The invention is not, however, restricted to this case. The transfer system may be used in particular for the transfer of flat objects from a stack of a multiplicity of confinement boxes, or from several flat objects contained in a single confinement box.

According to one particular embodiment of the coupling means, the latter may comprise a support base fixed to the processing unit and surrounding the opening of the processing unit, a mouth part, a sealed connector connecting the mouth part to the base support, and a mechanism for moving the mouth part in a transfer direction, between a retracted position, in which a box can be placed in front of the coupling means, and an opened position in which the mouth part is applied in sealed manner against the confinement box, to couple together the first and second openings. Preferably, the movement of the mouth part is a movement that is relative in relation to the base support.

When the mouth part is retracted, the first opening and one opening of the coupling means, at the end of the mouth part, are closed by the first and second shutters. This makes it possible to insulate the inside of the confinement box and the inside of the coupling means respectively. Also, since a connector links the mouth part to the base support in sealed manner, the inside of the processing unit is also insulated from the surrounding medium when, in the retracted position of the mouth part, the opening of the coupling means is closed by the second shutter. The confinement box can then be moved by a suitable mechanism so as to bring it in front of the coupling means.

Release of the first and second openings only takes place when the mouth part is in open position, pressing against the box.

To achieve a perfect seal, the mouth part may have a sealing rim and each confinement box may have a support band surrounding the first opening into which the sealing rim fits.

The second shutter may, for example, be made in the form of a pivoting door.

The means for releasing the openings of the first and second shutters may comprise a pivoting mechanism, connected to the second shutter, to cause the second shutter and the door of the confinement box to pivot between a shuttered position and an open position. In the open position, the inner volumes of the confinement boxes, of the coupling means, and of the processing unit open into one another.

For this purpose, the mouth part may, in particular, comprise a recess in a rear wall to receive the first and second shutters when they are in open position.

It is to be noted that, unlike known devices of the prior art, in which the doors of the confinement boxes are held and operated by a mechanism outside the confined medium, the door of the confinement box fitted with the system of the invention is held and pivoted inside the confined medium.

According to one aspect of the invention, the second shutter may be positioned in the mouth part on one side facing the confinement box. A third shutter, associated with the second opening, that is to say the existing opening of the processing unit, may also be positioned in the mouth part on the side facing the processing unit.

In one particular embodiment of the coupling means, the third shutter is a door and the base support has a sealing rim surrounding the second opening. The door forming the third shutter is then pressed in sealed manner against the sealing rim when the mouth part is in its retracted position. Conversely, the door is separated from the sealing rim when the mouth part is in its open position.

Under another particular embodiment of the coupling means, the mouth part may comprise a cylindrical part, mounted so that it is free to rotate on its axis in the mouth part, provided with a slot giving passageway to the flat object and with solid parts. The solid parts of the cylindrical part respectively form the second and third shutters.

According to a further aspect of the invention, the first and second shutters may comprise first mutual locking/unlocking means with which the first shutter can be locked on the second shutter.

More precisely, the first locking means may comprise one or more bayonet devices with locking parts of complementary shape respectively placed on the first and second shutters.

The locking part of the second shutter may, for example, be a key.

According to one improvement, the first shutter may also comprise second locking/unlocking means to make the first shutter integral with the confinement box, the second locking/unlocking means also being actuated by the key-forming part of the second shutter.

When the coupling means comprise a third shutter such as described above, the second shutter may, according to one particular embodiment of the system of the invention, be connected to the first shutter by means of small connecting rods that can be activated between a so-called distal position in which the second and third shutters are moved away from one another, and a so-called proximal position in which the second and third shutters are brought towards each other.

The invention also concerns a coupling device to join a confinement box to a processing unit for the transfer of a flat object from the confinement box to the processing unit, comprising:

a base supportable to be fitted to the processing unit around an opening of the processing unit, a mouth part with a shutter having a passageway for the flat object, a sealed connector connecting the mouth part to the base support, a mechanism for moving the mouth part in a transfer direction, between a position retracted towards the base support and an open position away from the base support, a mechanism for holding the box during coupling and for actuating the small connecting rods positioned in the confinement box, in order to move one door of the box towards the shutter of the mouth part, and a mechanism for freeing the passageway when the mouth part is in open position.

Other characteristics and advantages of the invention will be clearer on reading the following description in which reference is made to the appended drawings and which is given for illustrative purposes and is in no way restrictive.

SHORT DESCRIPTION OF THE FIGURES

Figure 4:
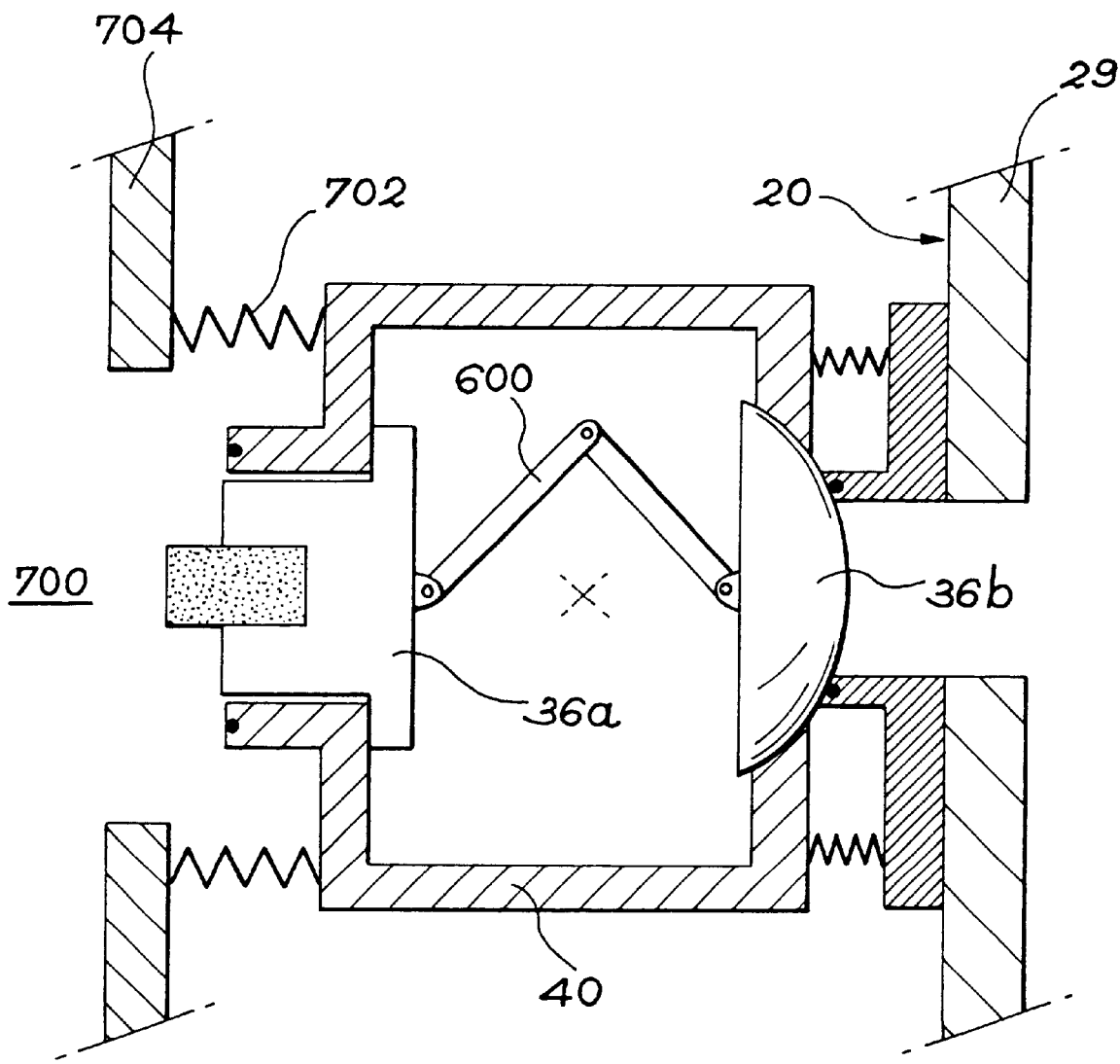
Figure 5A:
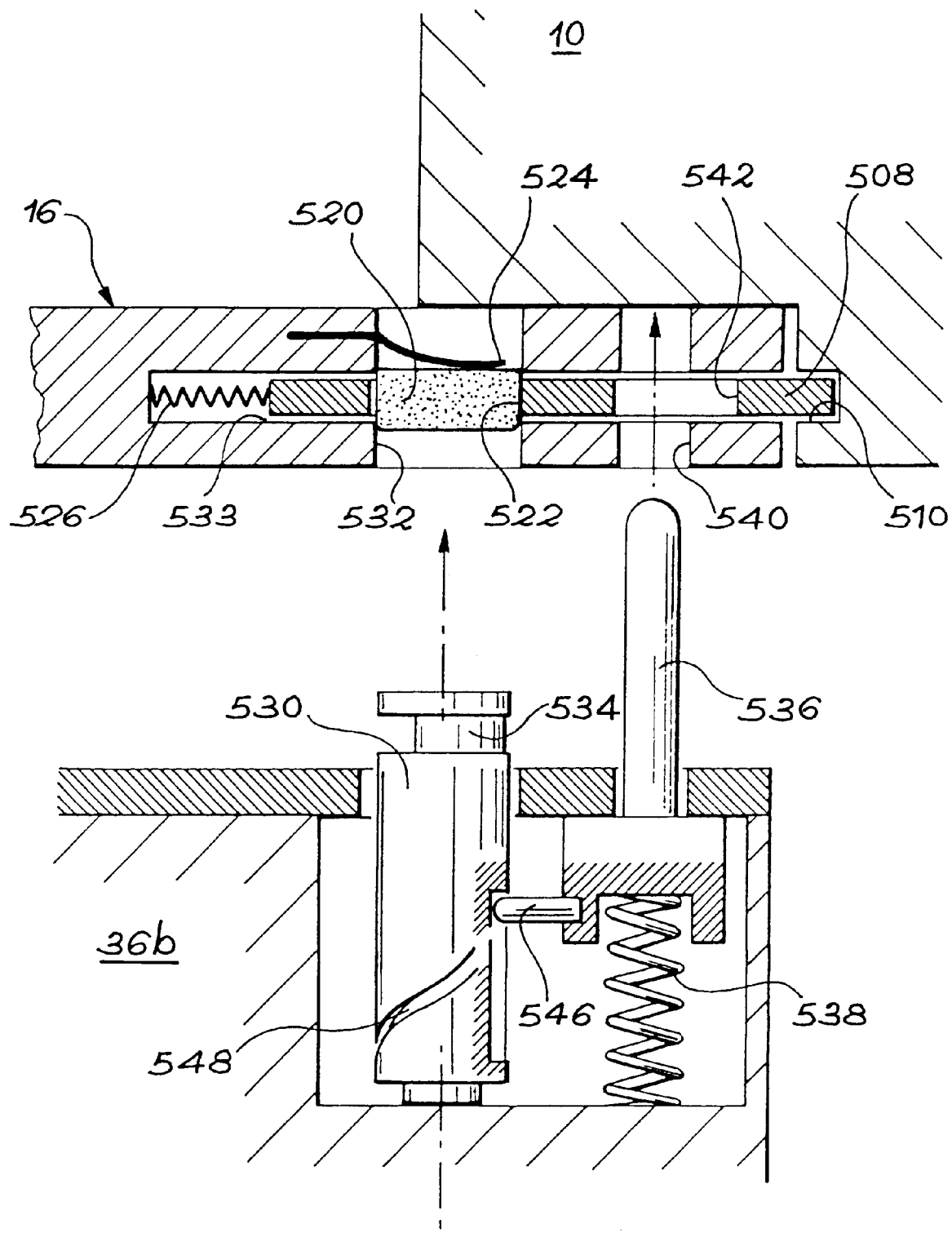
Figure 5B:
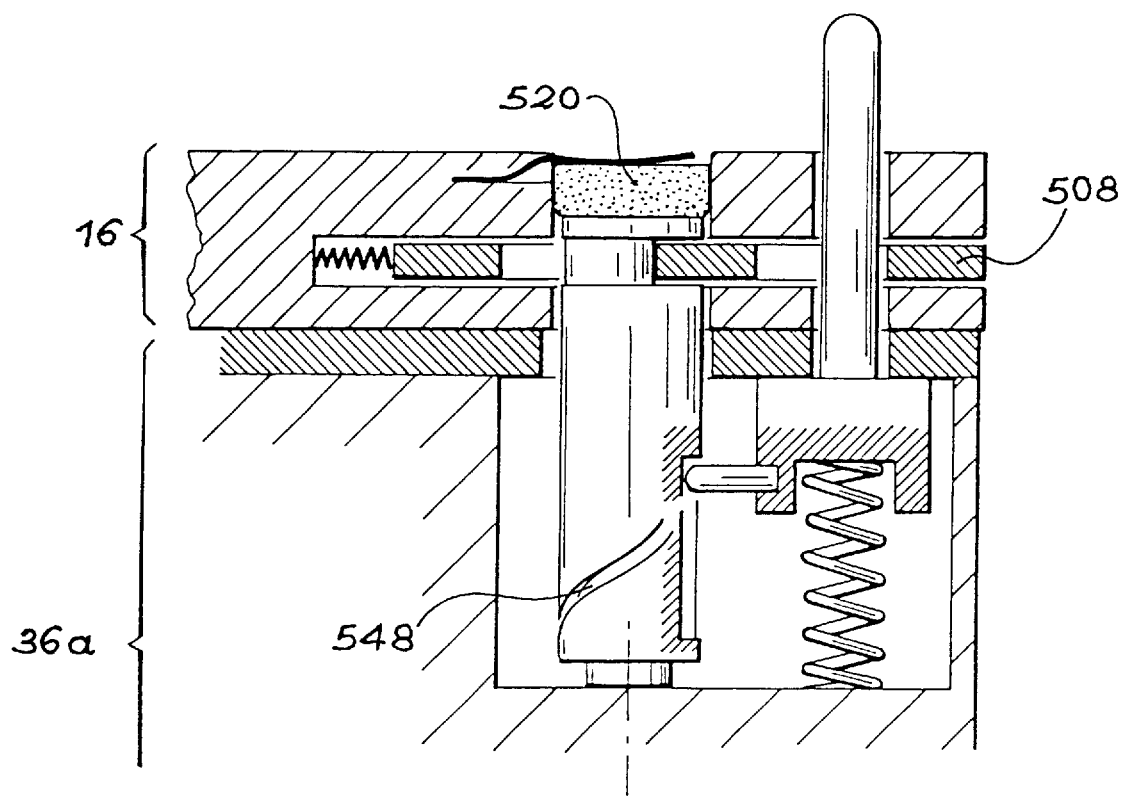
Figure 6:
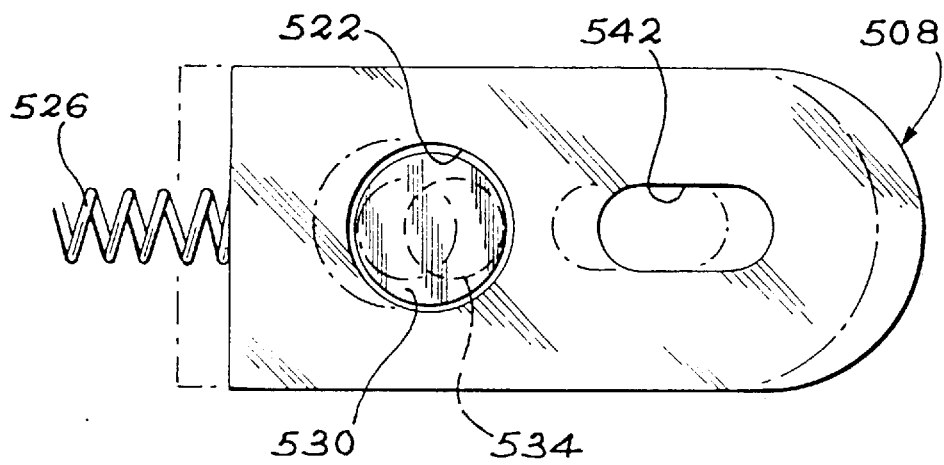
Figure 8:
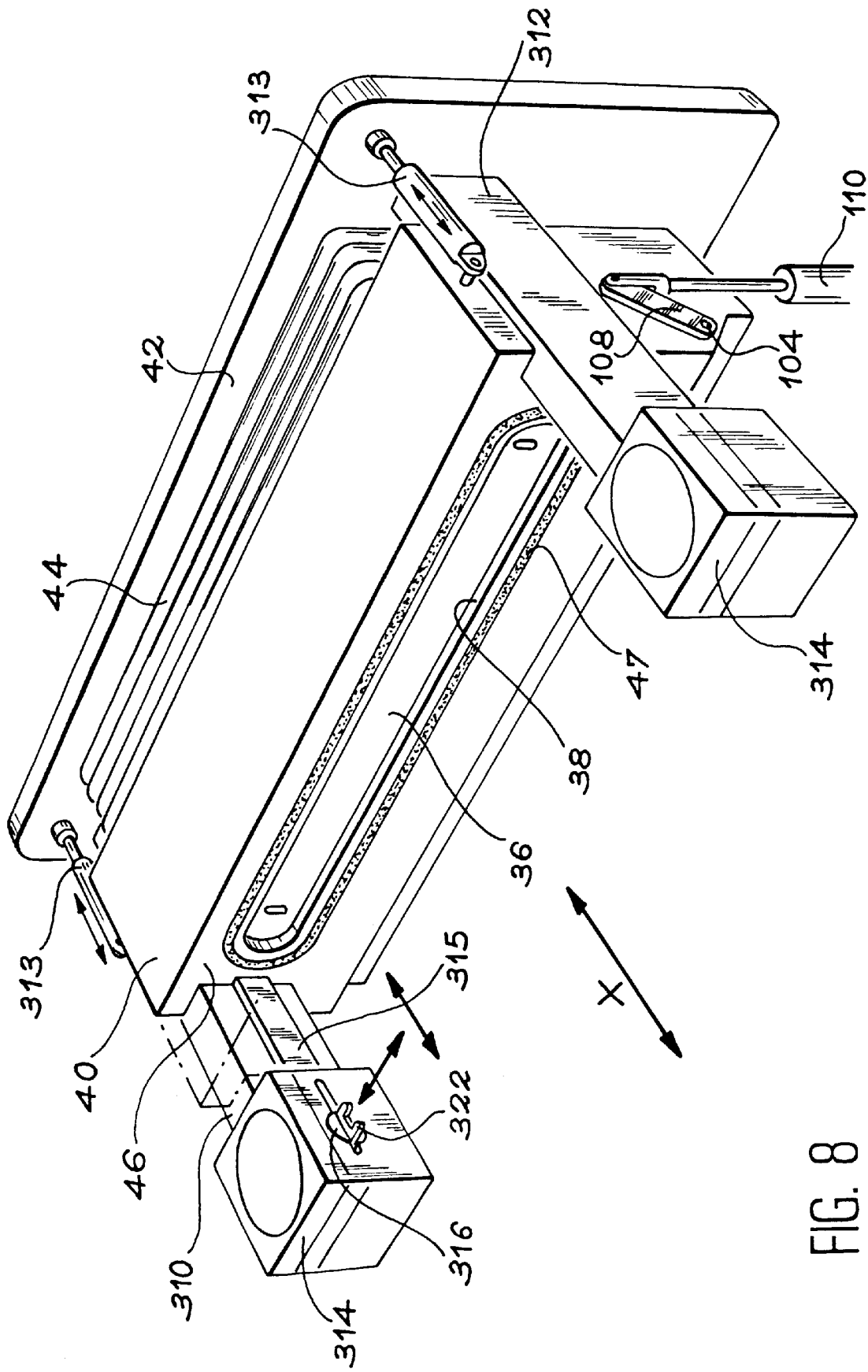
Figure 9A:
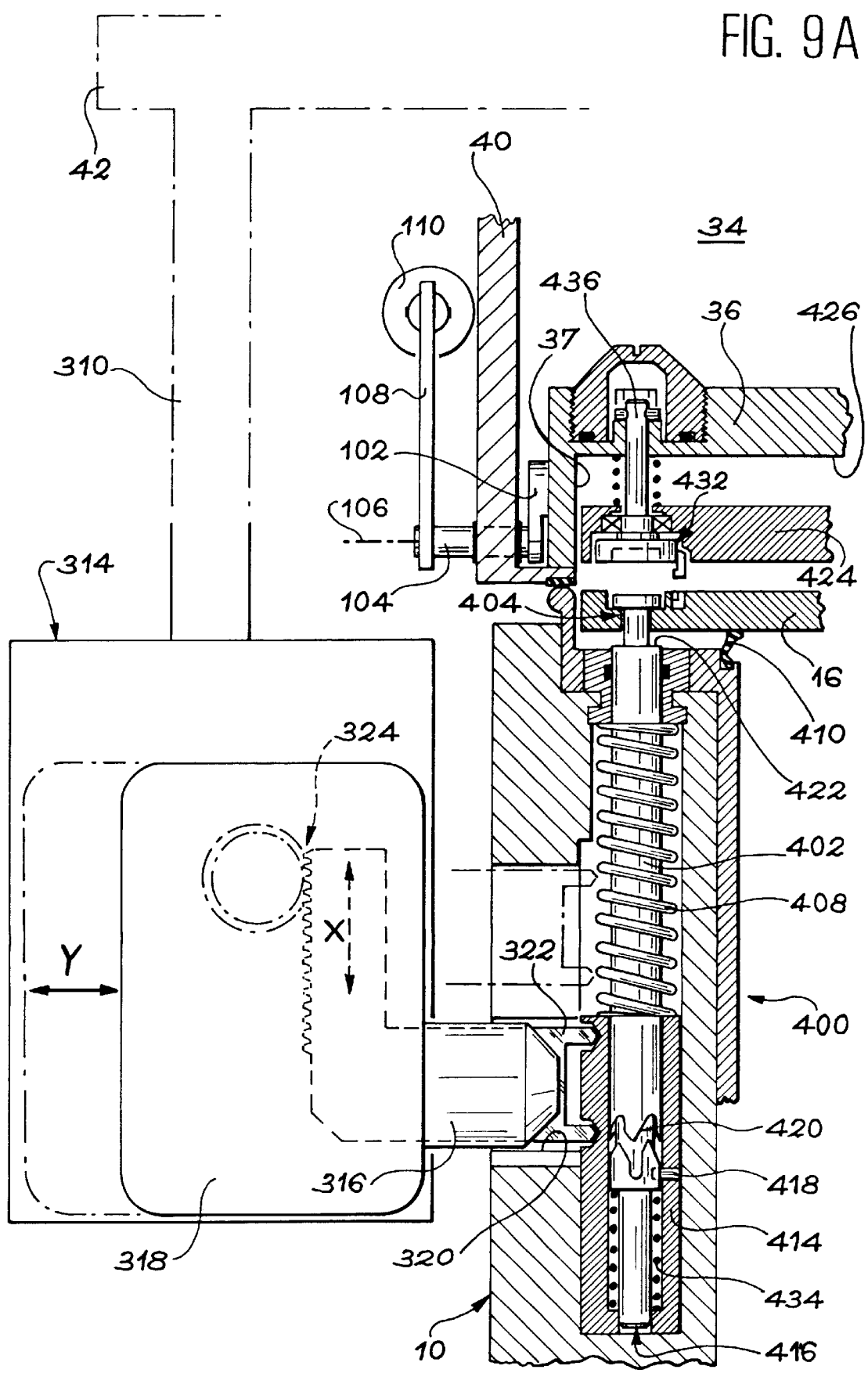
Figure 9B:
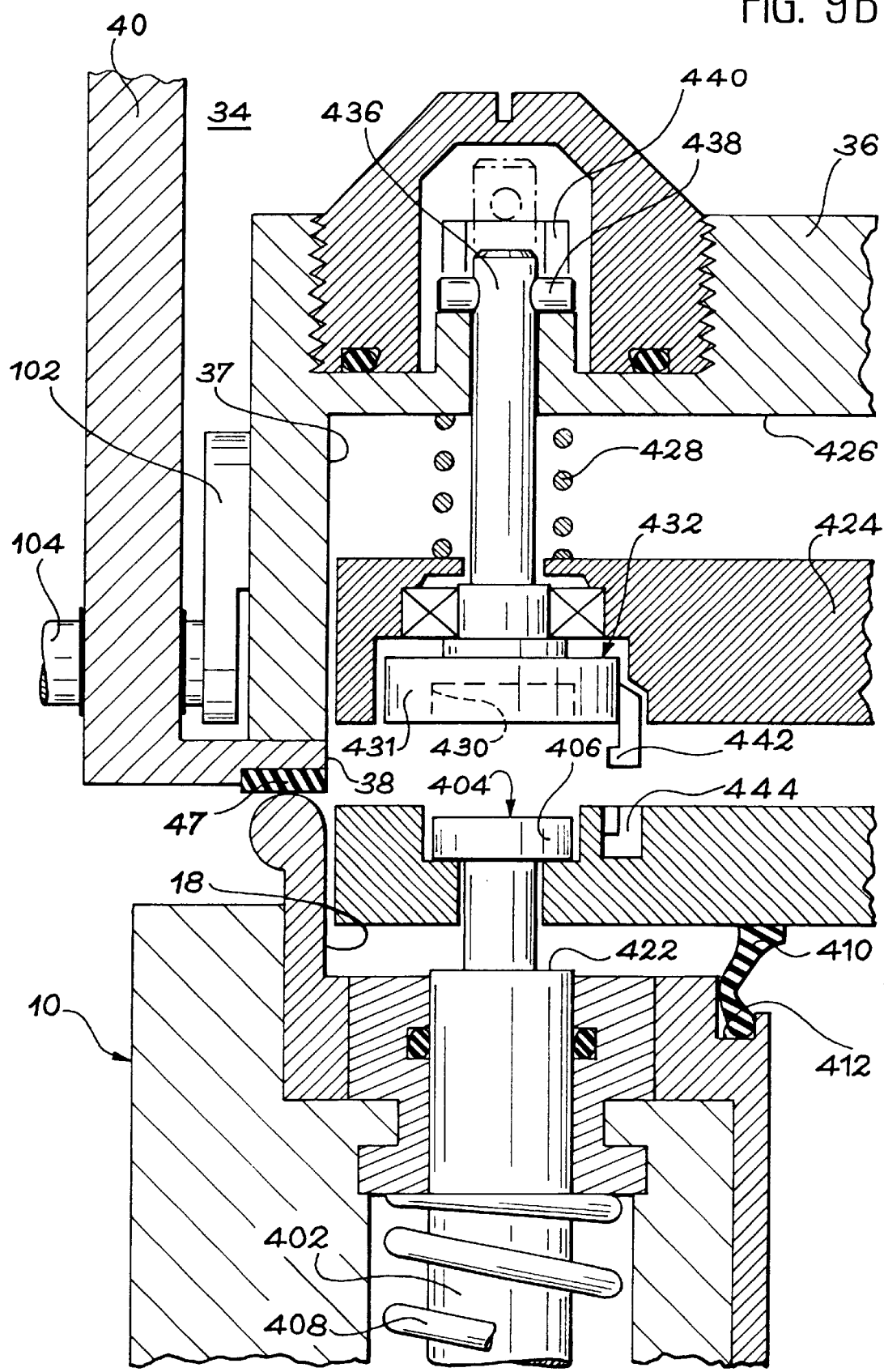

FIGS. 1A to 1F are simplified diagram sections of one particular embodiment of a system of the invention, illustrating its operating principle, FIGS. 2A to 2D are simplified diagram sections of a system of the invention according to another particular embodiment, FIGS. 3A to 3E are diagram sections of a variant of the system shown in FIGS. 2A to 2D, FIG. 4A is a diagram section of a variant of the system shown in FIGS. 3A to 3E, adapted to a vacuum transfer of flat objects, FIG. 4B is a diagram section showing the use of the coupling system of FIG. 4A for a vacuum transfer of flat objects, FIG. 5A is a section view of a locking system between one door of a confinement box and one shutter of the coupling system of the invention. FIG. 5A shows the locking system in a state in which the door of the confinement box and the shutter are disconnected, FIG. 5B is a section view of the locking system showing a state in which the door of the box is coupled to the second shutter, FIG. 6 is a top view of a locking cotter-pin for the door of FIG. 5 on a confinement box, FIGS. 7A to 7D are simplified diagram sections of a system of the invention according to further embodiment which forms another variant, FIG. 8 is an enlarged scale view of a coupling means which can be used in transfer systems of the invention, FIGS. 9A and 9B are enlarged scale sections of a detail of the system of the invention, FIG. 10, is a simplified representation of a transfer system of the invention, adapted to the transfer of flat objects from a stack of a multiplicity of confinement boxes.

DETAILED DESCRIPTION OF PARTICULAR EMBODIMENTS OF THE INVENTION

Essential elements of the transfer system and its operating principle are shown in FIGS. 1A to 1F which correspond to successive stages of a transfer operation. For better clarity, identical or similar elements in the different figures carry the same reference numbers.

In FIGS. 1A to 1F a confinement box, shown in part, is designated reference 10. It contains a flat object 12 such as a semiconductor wafer, for example. Flat object 12 is housed in the inner volume 14 of the box which encloses a clean, optionally pure, atmosphere, that is to say free from chemical contaminants.

A door 16 serves as a shutter for a side opening 18 in box 12 also called first opening. Door 16 closes the first opening in FIG. 1A.

Reference 20 designates a processing unit in which the flat object must undergo processing. This processing, when the flat object is a silicon wafer in particular, corresponds to the fabrication stages of electronic components. The processing may comprise depositing, etching, shaping operations etc . . .

A manipulator robot 22, partially shown, housed in the processing unit in rest position, is provided to remove flat object 12 from box 10 and bring it into the processing unit.

Inner volume 24 of the processing unit also comprises a clean, possible pure, atmosphere. Volume 24 may also be "vacuumed" that is to say at low pressure. This is the case for an increasing number of processing units.

An opening 28, called second opening, existing in a side wall 29 of the processing unit is provided for the transfer of objects.

Coupling means 30 joining confinement box 10 to processing unit 20, that are fixed to the processing unit, outline a space 34, sealed in relation to the surrounding medium, to allow the passage of flat object 12 of confinement box 10 towards processing unit 20.

A shutter 36 is associated with an opening 38 of a mouth part 40 of coupling means 30.

Shutter 36 enables inner volume 34 of coupling means 30, and inner volume 24 of processing unit 20, to be insulated in sealed manner from the surrounding medium when the coupling means are not connected to opening 18 of confinement box 10.

Coupling means 30 also comprise a base support 42 fixed to wall 29 of the processing unit and surrounding second opening 28. A sealed connector 44, in the form of bellows, connects mouth part 40 to base support 42.

Figure 1B:
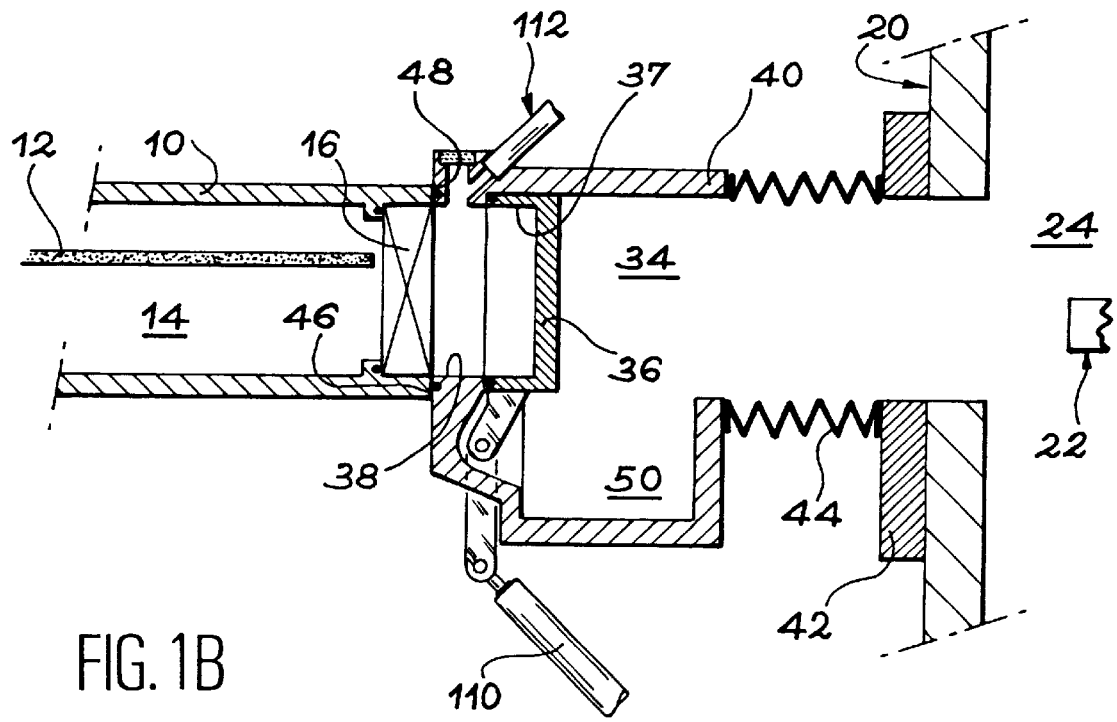

A jack system, not shown in FIGS. 1A to 1F for simplification reasons, is used to move mouth part 40 parallel to transfer direction X of the flat objects, between a retracted position towards the processing unit (see FIG. 1A) and a so-called opened position towards the confinement box (see FIG. 1B for example).

During a first stage of a transfer process corresponding to FIG. 1A, confinement box 10 is positioned opposite opening 38 of the mouth part, and is consequently brought in front of second opening 28 of the processing unit. Means for positioning the box are not shown in the figure.

During this first stage, door 16 is in closed position on opening 18 of box 10, and shutter 36 is in closed position on opening 38 of mouth part 40. Mouth part 40 is in its retracted position. Inner volumes 14 and 24 of the box and processing unit are therefore insulated from one another and from the outside environment.

A second stage, shown in FIG. 1B, consists of moving the mouth part to its opened position and applying a sealing rim 46 of mouth part 40, surrounding opening 38, against a support band 48 of box 10. Support band 48 fully surrounds opening 18 of the box and its size is adapted to sealing rim 46 so that sealed contact can be obtained between these parts.

A mechanism described below enables door 16 to be pushed against shutter 36 and to lock these two parts one on the other in order to make them integral with one another. This mechanism is not shown in FIGS. 1A to 1F.

Study of the figures leads to ascertaining that shutter 36 is provided for this purpose with a recess 37 whose size and shape are adapted to those of door 16 and box 10.

Figure 1C:
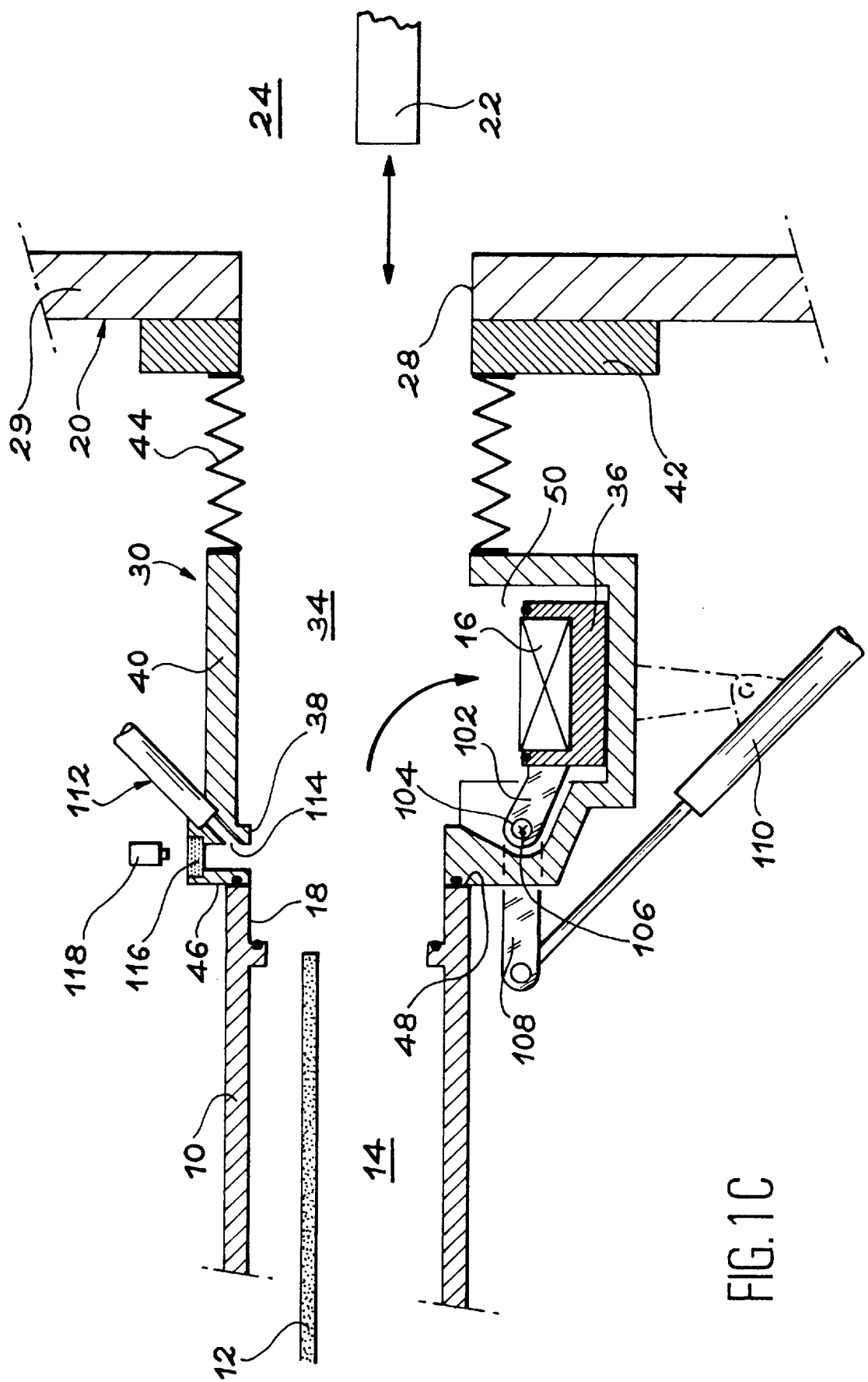

In a third stage shown in FIG. 1C, the integral unit formed by door 16 and shutter 36 is pivoted towards an open position, in a housing 50 of mouth part 40, in such manner as to free openings 18 and 38.

Volumes 14, 24 and 34 are therefore made to communicate with one another, but remain insulated from the outside environment.

Shutter 36, positioned in mouth part 40, is connected by an arm 102 to a pivot 104 extending along an axis 106 perpendicular to the section plane of the figure, and perpendicular to the direction of transfer of the flat object. A second actuating arm 108 has one end integral with pivot 104 and one end connected to an actuating jack 110 integral with mouth part 40. Pivot 104 passes sideways across the wall of the mouth part from arm 102 of the shutter which is placed inside the mouth part, as far as arm 108 placed outside this part, as is jack 110.

By actuating jack 110, it is possible to pivot shutter 36 and door 16, between a shut position of opening 38 and a position freeing this opening. In this latter position, shutter 36 and door 16, as indicated above, fit into housing 50 provided at the rear of mouth part 40. The unit formed by jack 110, arms 102 and 108 and pivot 104 is also called the pivoting mechanism.

Advantageously, mouth part 40 may be equipped with a draining system 112 comprising a gas injection nozzle 114 and a gas outlet not shown in the figures. The drain system placed in the vicinity of sealing rim 46 is used to insufflate into coupling means 30 and into confinement box 10 a gas such as nitrogen in order to remove any particulate or chemical contaminants which may be present.

This system can in particular remove the contaminant elements released by the flat object itself.

Mouth part 40 may also be fitted with an observation window 116 in transparent material. This window is also positioned in the vicinity of sealing rim 46. Optoelectronic instruments 118 such as passage detectors, position detectors, telemetric detectors or optical code readers, are placed opposite window 116.

Instruments 118 can be used to detect the passage of the flat object or a grasping finger for the object, described below, in the mouth part.

The transfer operation may also be controlled, and possibly interrupted, in the event of detection of wrong positioning of the object or grasping finger. This avoids any damage to the flat object and/or transfer system in the event of a hitch and especially any generation of particles due to untoward friction.

Also, the instruments may be equipped for the reading of a code of ASCI bar code type, printed on the edge of the flat object allowing its identification for example.

Figure 1D:
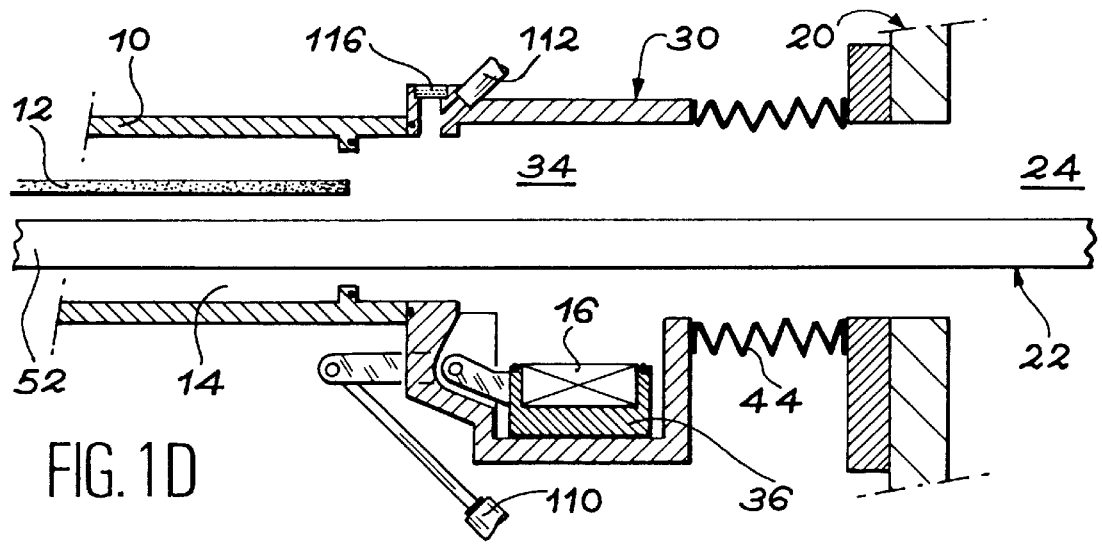

A fourth stage, shown in FIG. 1D, corresponds to the actual transfer of the flat object.

Manipulator robot 22 presents a grasping finger 52 which moves into box 10, under flat object 12, crossing coupling means 30.

Finger 52 is lifted to take hold of flat object 12 from underneath.

When the object is supported by tray 52, the latter is retracted into processing unit 20. Flat object 12 is then transferred across coupling means 30 without ever leaving its own surrounding atmosphere.

Figure 1E:
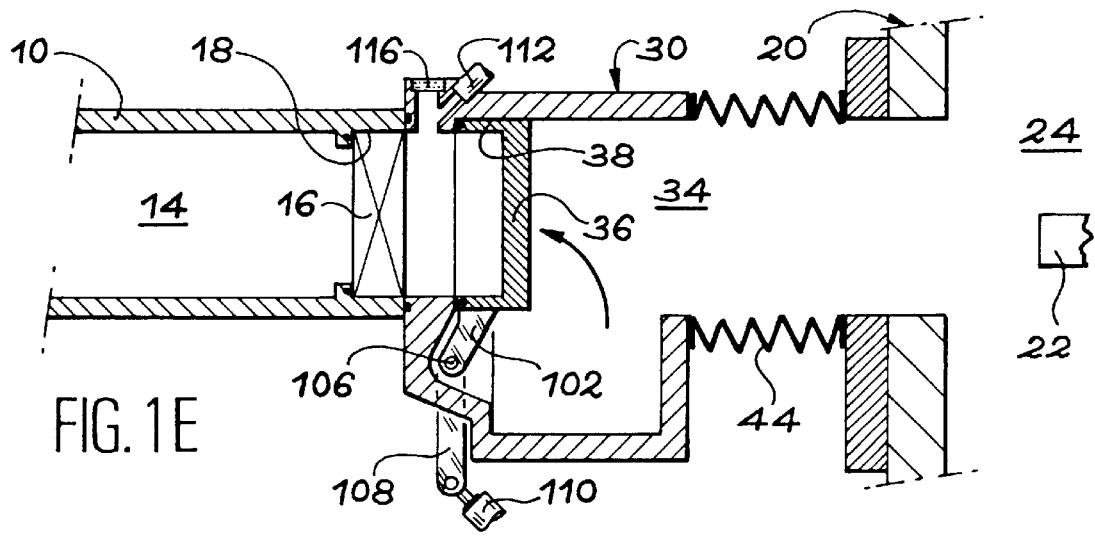
Figure 1F:
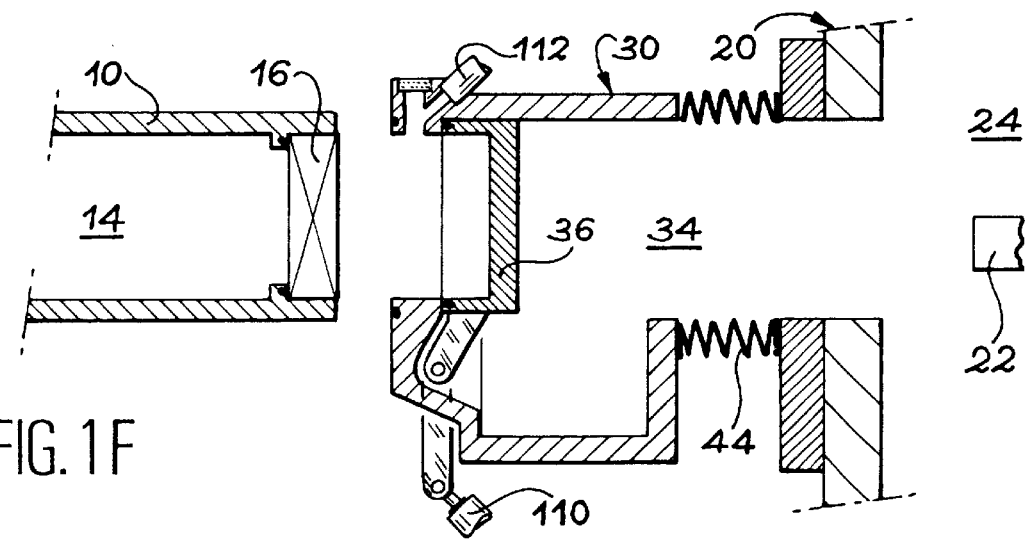

FIG. 1E corresponds to a next-to-last stage during which shutters 16 and 36 are again pivoted to return to their shutting position of openings 18 and 38. The shutters are also disconnected from one another by a mechanism described below, to return to their position corresponding to FIG. 1B.

It will be noted that the flat object may either remain temporarily in the processing unit, or be re-transferred back into the same confinement box before shutting of openings 18 and 38.

In a last stage shown in FIG. 1F, mouth part 40 is again retracted towards its initial position in direction of the processing unit.

Opening 18 of the confinement box and opening 38 of the mouth part are respectively closed by door 16 and shutter 36.

A transfer system conducted in accordance with the figures of principle 1A to 1F is well adapted to transfer in a clean, pure atmosphere.

It is less adapted however to transfer in a vacuum. Great demand may be placed on the shutters, in particular second shutter 36 and bellows 44, through the difference in pressure existing between the inside of the processing unit and the outside medium.

FIGS. 2A to 2D represent the operating principle of a variant of embodiment of the transfer system of the invention, that is better adapted to transfer in a vacuum.

Similar elements to those shown in FIGS. 1A to 1F carry the same references and are not described in detail. Reference may be made to the preceding description.

Inner volume 24 of the processing unit is constantly maintained in a vacuum. On the other hand, inner volumes 14 and 34 of the confinement box and coupling means are only placed in a vacuum for the transfer of the flat object.

Through their design, coupling system 30 and especially confinement boxes 10 are not generally able to resist outside atmospheric pressure when their inner volume is placed in a vacuum.

Therefore a pumping enclosure 60 is provided which surrounds confinement box 19 and coupling means 30. This enclosure is connected in sealed manner to wall 29 of the processing unit.

The vacuum is made simultaneously in pumping enclosure 60, in box 10 and in coupling means 30, so that at no time is the pressure difference too great between the inside and outside of these parts.

Figure 2A:
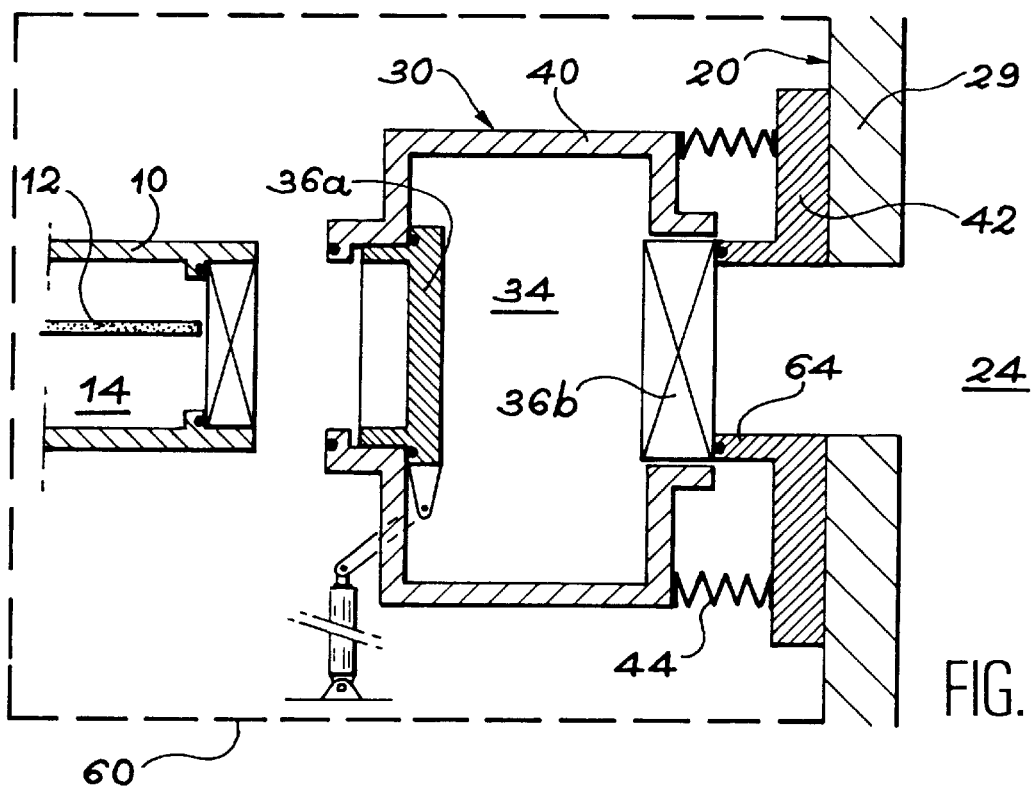
Figure 2B:
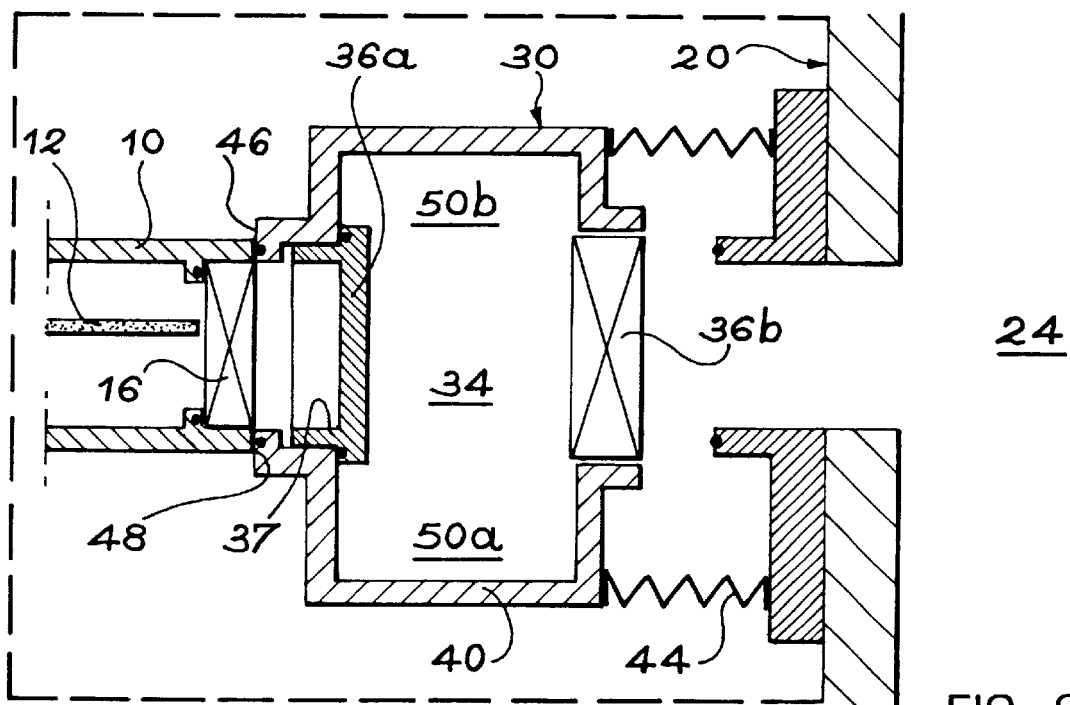
Figure 2C:
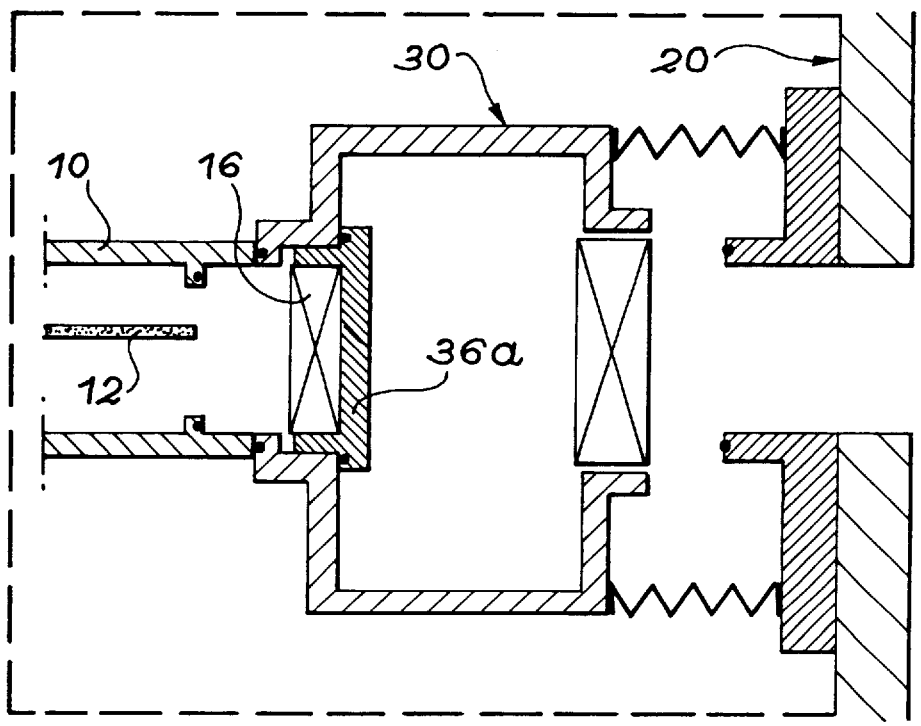
Figure 2D:
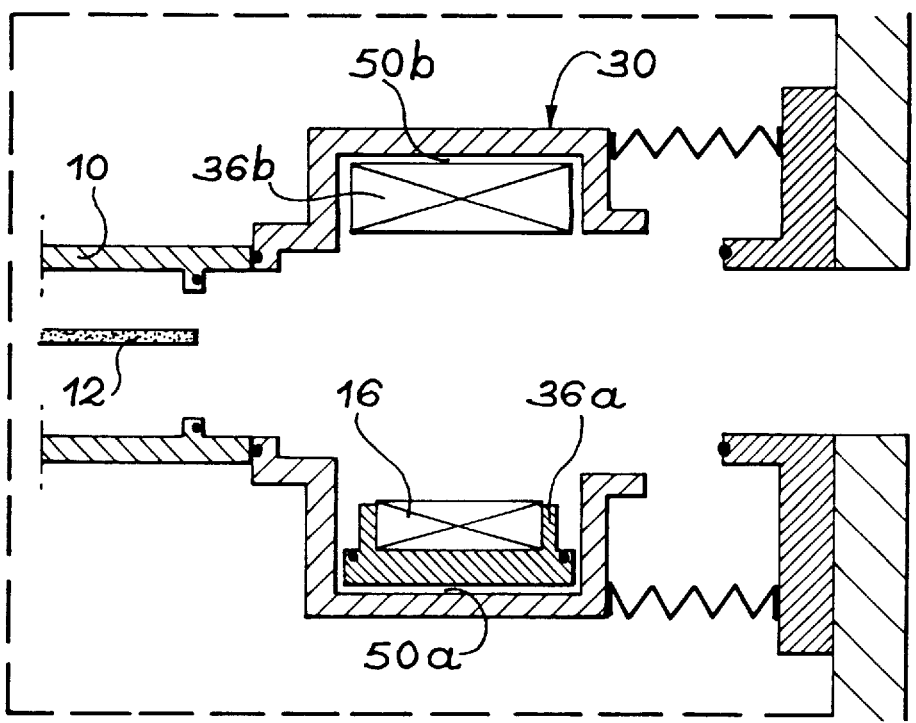

As in the embodiment illustrated in FIGS. 1A to 1F, the mouth part of FIGS. 2A to 2C comprises a shutter 36a with which it is possible to shut opening 38. This shutter is always called "second shutter". Mouth part 40 however also comprises anther shutter 36b, called "third shutter" adapted to second opening 28. The third shutter may be pressed against a rim 64 of base support 42 which surrounds opening 28 of the processing unit.

When the mouth part is in the retracted position shown in FIG. 2A, shutter 36b closes opening 28 of processing unit 20. Therefore inner volume 34 of the coupling means may be brought to atmospheric pressure without placing too great demand on shutter 36a or bellows 44. The stresses due to the pressure difference between the outside and inside of the processing unit are fully borne by shutter 36b.

Before moving mouth part 40 towards its opened position shown in FIG. 2B, pumping is carried out in enclosure 60, in confinement box and in coupling means 30. For simplification reasons, the pumping inlets in the different parts and the pumps themselves are not shown in the figures. It is also recalled that inner volume 24 of the processing unit is constantly maintained in a vacuum.

In a second stage, shown in FIG. 2B, mouth part 40 is moved towards confinement box 10 and its sealing rim 46 is applied against support band 48 of the box.

During a third stage, when door 16 is pushed against shutter 36a, to be locked on the shutter, the latter can take up position in a recess 37 of door 36a. This stage is illustrated in FIG. 2C.

Finally, to free a passageway for flat object 12, from the confinement box towards the processing unit or reciprocally, shutter 36a with door 16, like shutter 36b, are pivoted to take up their respective positions in housings 50a and 50b provided for this purpose in mouth part 40. This operation corresponds to FIG. 2D. The pivoting mechanisms for shutters 36a and 36b are substantially identical to the pivoting mechanism described in correlation with FIG. 1C. These mechanisms are not shown in detail in FIGS. 2A to 2D.

It should be specified that the device shown in FIGS. 2A to 2D may also be suitable for the transfer of flat objects under atmospheric pressure. In this case, pumping enclosure 60 is superfluous.

FIGS. 3A to 3E show the operating principle of a further variant of embodiment of the transfer system of the invention.

Identical or similar elements to those in FIGS. 2A to 2D carry the same numbers. Reference may therefore be made in their respect to the preceding description.

Figure 3A:
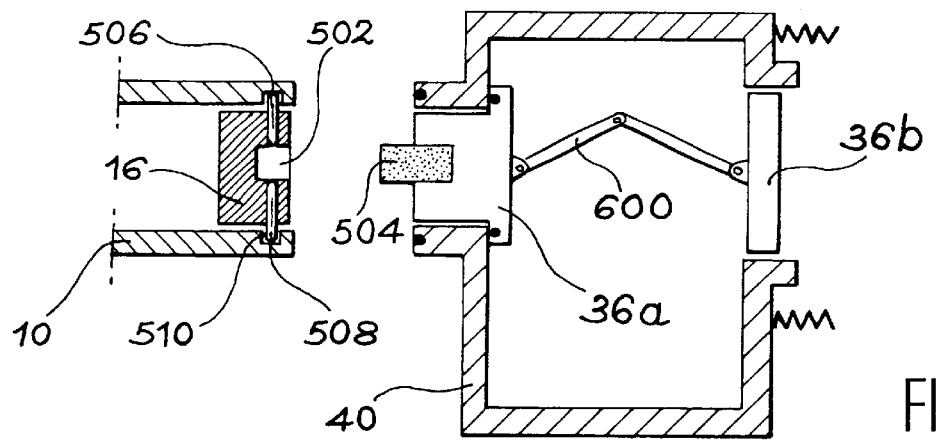

In FIG. 3A, it will be noted that door 16 of confinement box 10, which forms the first shutter, has an imprint 502. Second shutter 36a comprises an appendage 504, forming a key, whose shape is complementary to that of imprint 502 and which, with imprint 502, forms a bayonet device.

The following description refers to a single bayonet device. However, the first and second shutters may be fitted with said device at each of their side ends.

Reference 506 designates a means of locking door 16 on confinement box 10.

Locking means 506 of which an example of embodiment is described in more detail below, comprises cotter pins 508 for example, which fit into grooves 510 of confinement box 10.

Appendage 504 forming a key is designed in such manner as, firstly, to unlock locking means 506 of door 16 when it is inserted into imprint 502, and secondly to lock door 16 of the confinement box on the second shutter 36a.

Figure 3B:
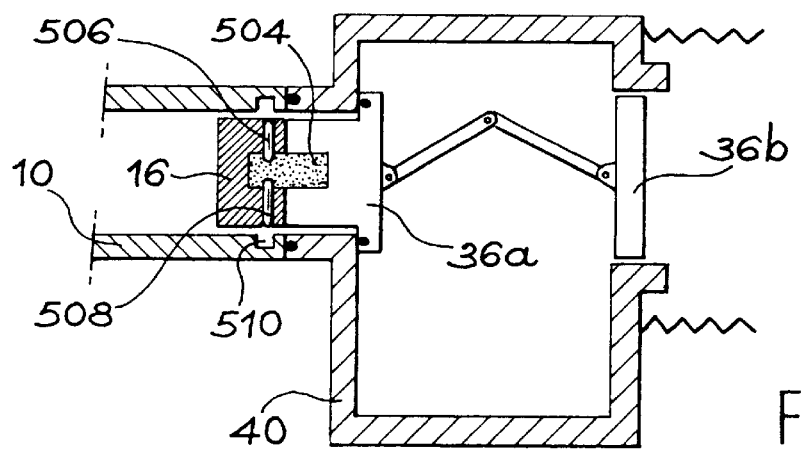

The joining of second shutter 36a and door 16, and the unlocking of cotter-pins 508 of door 16 can be seen in FIG. 3B.

In FIGS. 3A and 3B, it will also be noted that second shutter 36a and third shutter 36b are connected by a system of small connecting rods 600. These small connecting rods are actuated by a mechanism that is not shown in the figures. The position occupied by the second and third shutters in FIGS. 3A and 3B is called the "distal" position.

Figure 3C:
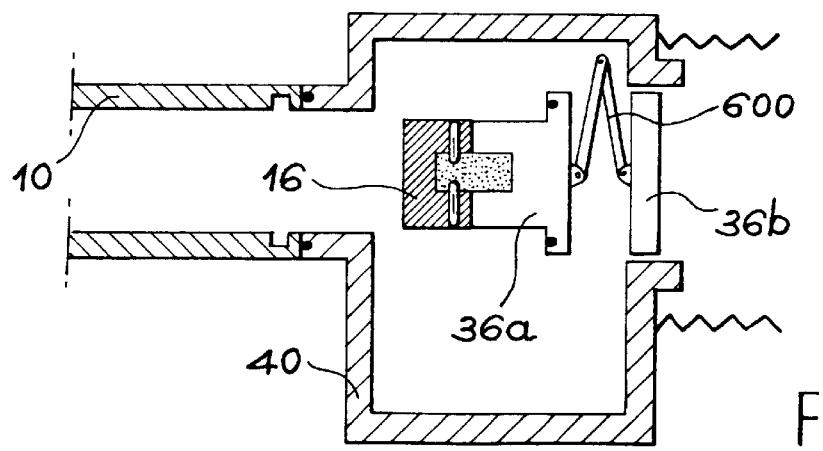

During an opening stage of the confinement box, shown in FIG. 3C, the small connecting rods are actuated to bring second shutter 36a close to third shutter 36b until they occupy the near position shown in FIG. 3C called "proximal position".

It will also be noted in FIG. 3C that door 16 is now integral with second shutter 36a.

Small connecting rods 600 are mounted to rotate around an axis (not shown) in the mouth part so that they cause the second and third shutters to pivot between an angular so-called horizontal position, in which the second and third shutters are positioned substantially parallel to the opening of the processing unit, and an angular so-called transfer position in which the second and third shutters are positioned substantially perpendicular to the opening of the processing unit.

Figure 3D:
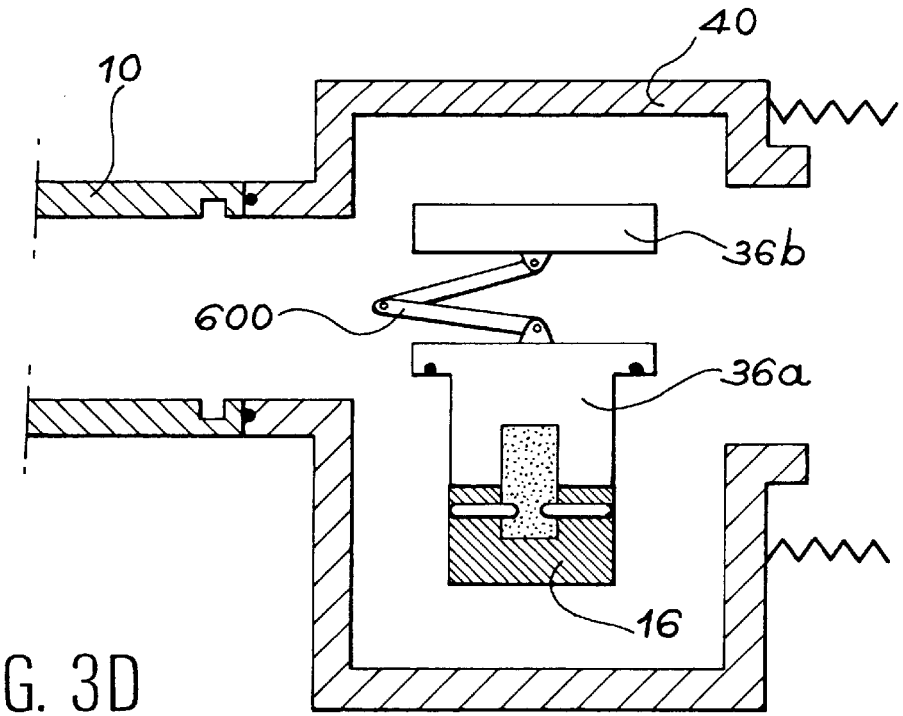
Figure 3E:
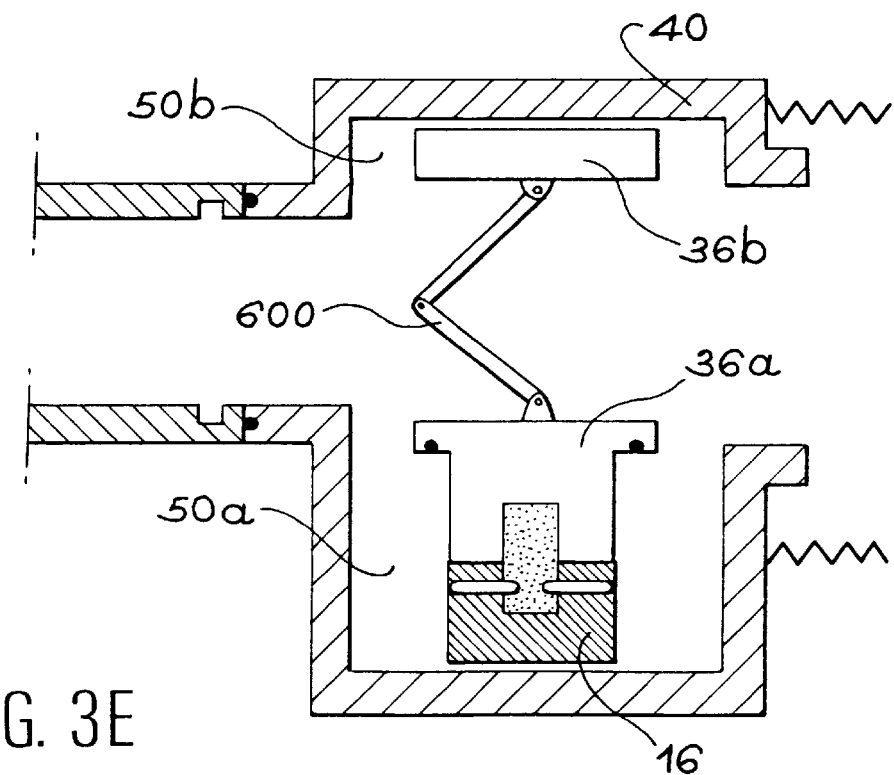

The horizontal angular position corresponds to the angular position of the shutters shown in FIGS. 3A to 3C, while the angular so-called transfer position is shown in FIGS. 3D and 3E.

More precisely, in FIG. 3D, the second and third shutters occupy their proximal position and their angular so-called transfer position. In these positions, the openings of the mouth part are freed, but the transfer of the flat object remains impossible insofar as the shutters occupy the passageway of the objet into the mouth part.

Therefore, as is seen in FIG. 3E, small connecting rods 600 are again actuated to bring the shutters into their distal position. When the shutters are in the angular position of transfer and in their distal position, they move to occupy housings 50a, 50b provided in mouth part 40 for this purpose.

In these positions, the transfer of the flat object becomes possible. It is to be noted in this respect that the small connecting rods are situated either side of the side ends of the shutters in order not to hinder the passageway of the flat object.

FIG. 4A shows a particular embodiment of the device in FIGS. 3A to 3E. This embodiment is particularly suitable for the transfer of flat objects from confinement boxes located in a vacuum airlock 700. In FIG. 4A, identical elements to those in FIGS. 2A to 2D or 3A to 3E carry the same references.

Unlike the preceding figures, the presence of metal bellows 702 will be noted, connecting the front face of mouth part 40 to walls 704 which demarcate a transfer opening 706 of the vacuum airlock.

In this case, the coupling system of the invention is used as a connection between the vacuum airlock and the processing unit.

It will also be noted that door 36b has an arc-shaped joint edge to facilitate pivoting in the angular transfer position.

FIG. 4B shows vacuum airlock 700 in more detail which can contain several confinement boxes 10 from which or in which flat objects are unloaded or loaded. It will be seen in FIG. 4B that boxes 10 are closed by a door 16 that adapts to shutter 36a of the transfer system.

FIGS. 5 and 6 described below illustrate a particular embodiment of the locking means of door 16 on second shutter 36a, and of the locking means of door 16 on confinement box 10.

In FIG. 5A, references 16 and 10 respectively indicate the door of the confinement box and the confinement box itself that is partly shown. For simplification reasons, the sealing elements between the door and the box are not shown in this figure.

Door 16 is locked on box 10 by a cotter-pin 508 which fits into a groove 510 of box 10.

The cotter-pin is held in its locking position by means of a wedge 520 which fits into a recess 522 of the cotter-pin under the action of a spring 524.

Also, a spring 526 is provided to draw the cotter-pin into unlocking position when wedge 520 is moved out of recess 522.

Second shutter 36a, partially shown, comprises a key 539 mounted so that it can rotate and is able to fit into recess 532 of door 16.

One head of key 530 is adjusted so that it can push wedge 520 of cotter-pin 508 and lock into recess 522 of this cotter-pin when second shutter 36a is applied against door 16.

The locking/unlocking means of the second shutter are also fitted with a finger 536 loaded with a spring 538 which rises vertically from the second shutter.

When shutter 36a is brought close to door 16, finger 536 moves through openings 540, 542 made in door 16 and cotter-pin 508 and comes to lean against box 10.

As shutter 36a nears door 16, finger 536 is pushed backwards. A pawn 546 integral with finger 536 inserts itself into a cam 548 of key 530 causing the latter to turn halfway.

Key head 530 is fitted with an eccentric groove 534 which, under the rotating effect of a half-turn induced by the recoil of finger 536, releases cotter-pin 508 which, drawn by spring 526, releases itself from imprint 510. Door 16 is therefore unlocked from box 10.

By so doing, cotter-pin 508 also moves into the eccentric groove to lock door 16 on shutter 36a, thereby causing the door to fold away. This situation is illustrated in FIG. 5B.

FIG. 6 shows the two positions of cotter-pin 508. The continuous line represents the locking position of the door on the box, and the dotted line represents the position in which the door is released from the box and also corresponds to the locking position of door 16 on the shutter.

Also, under the rotating effect of the key, the eccentric key head moves into door 16, thereby locking door 16 onto shutter 36a. More precisely, the key head fits into a guide 533 in which cotter-pin 508 slides.

Therefore, through the same rotation movement of the key, firstly the door of the box can be unlocked, and secondly the door can be locked onto the second shutter which, in this case, can be considered as a counter-door.

When the joined door and counter-door unit is withdrawn from box 10, finger 536 returns to its position illustrated in FIG. 5B under the action of spring 538.

To close box 10 (FIG. 5A) after a transfer of objects, and therefore to release box 10 from the coupling system in order to have access to other boxes 10, an internal mechanism of the coupling system brings back the unit, formed by shutter 36a and door 16 shown in FIG. 5B, into the coupling position with the confinement box.

Finger 536 again comes to press against box 10 and is pushed backwards. Key 530 makes a half-turn and the eccentric groove pushes back cotter-pin 508 into locking position of door 16 onto box 10 (FIG. 5A). In this position, it is possible to disconnect door 16 from shutter 36b, key 530 being released from cotter-pin 508. When shutter 36a is withdrawn, wedge 520, recoiled by spring 524, takes the place of the key, locking cotter-pin 508 into position, in the position in which door 16 and box 10 are joined.

FIGS. 7A to 7D show a variant of embodiment of the second and third shutters. These figures correspond to the same stages as FIGS. 2A to 2D respectively.

The second and third shutters are formed by a single cylindrical part 200 seen in cross section in the figures. It has a longitudinal slit to allow passage of the flat object. The size of this slit is substantially the same as that of openings 18 or 28 of the confinement box and the processing unit. As an example, the slit may have a width of 1 to 3 cm for a length of 20 to 30 cm.

The cylindrical part is mounted in mouth part 40 such that it can rotate on its own axis 204.

When mouth part 40 takes up its retracted position (FIG. 7A) cylindrical part 200 is oriented is such manner that slit 202 is substantially perpendicular to the direction of transfer X.

The solid parts of the cylinder carrying references 236a and 236b are respectively supported, in sealed manner, by a front edge 206 of the mouth part and by rim 64 of base support 42. The shape of front edge 206 is complementary to the cylinder shape to achieve sealed contact. The imperviousness of cylinder parts 236a and 236b can be improved with seal rings. These seal rings are provided for example on the end of edge 64 and on part 236a of the cylinder.

It is apparent that parts 236a and 236b have identical functions to those of shutters 36a and 36b of FIGS. 2A to 2D.

Figure 7A:
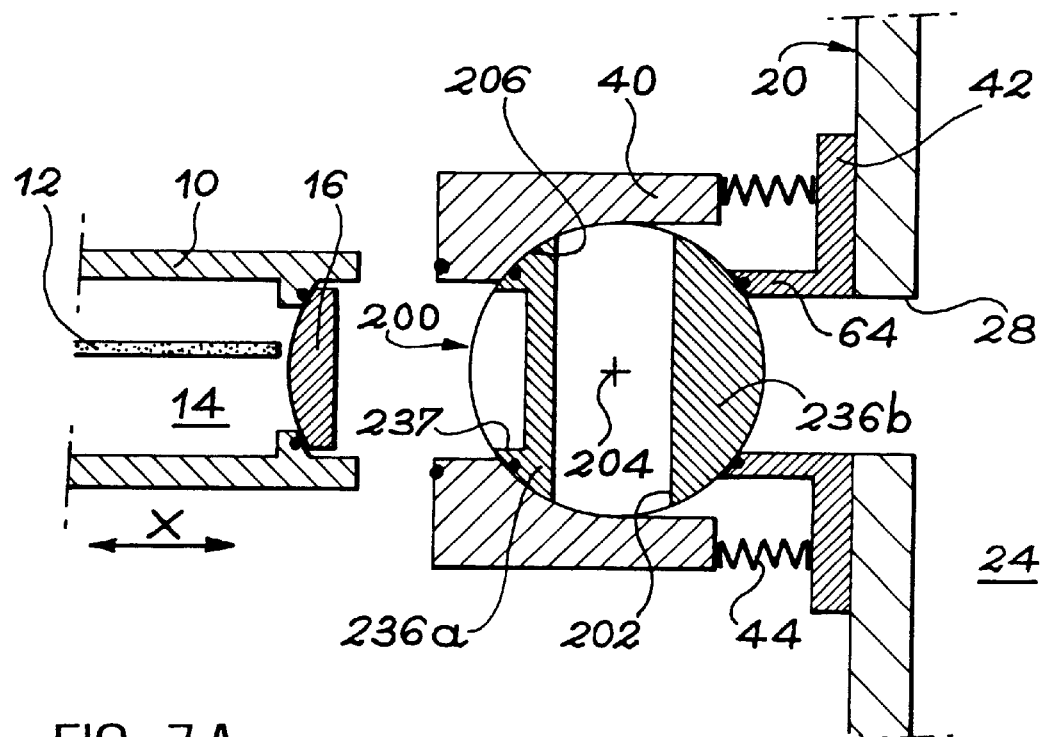
Figure 7B:
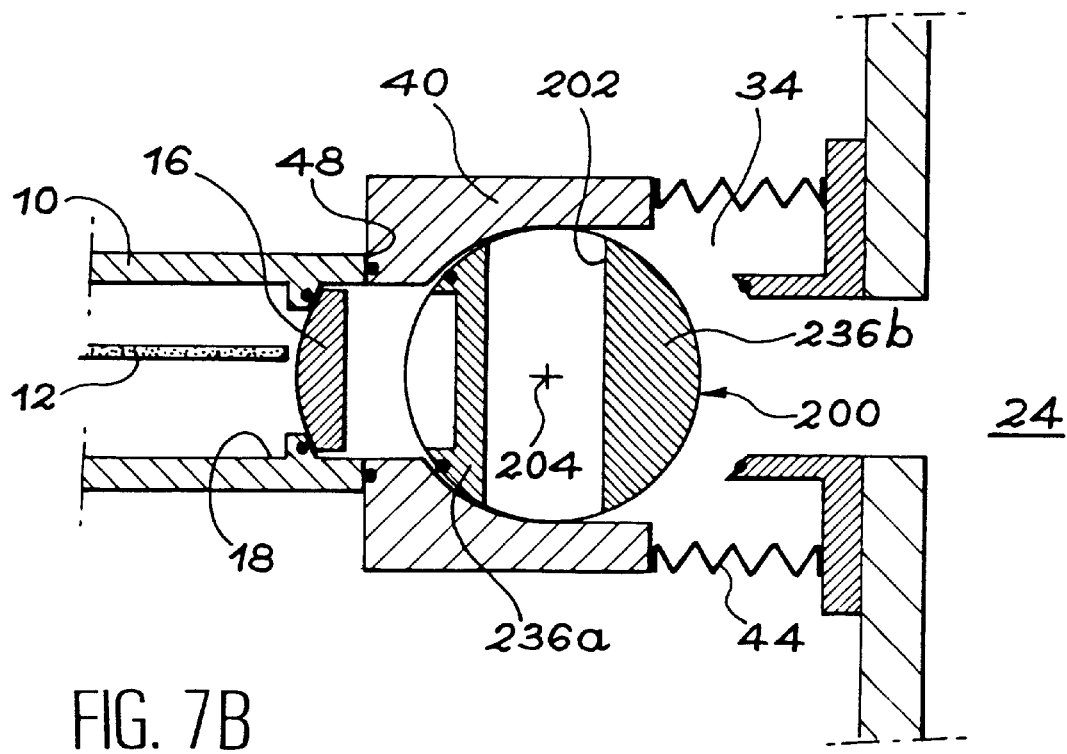

FIG. 7B corresponds to the movement of the mouth part from its retracted position to its opened position. Its sealing rim 46 is applied against support band 48 of the confinement box.

During this movement, cylinder 200 remains in its position in which slit 202 is substantially perpendicular to the direction of transfer. But, part 236b of the cylinder is drawn away from rim 64 of support base 42 and inner volumes 24 and 34 of the processing unit and coupling means communicate with one another.

Figure 7C:
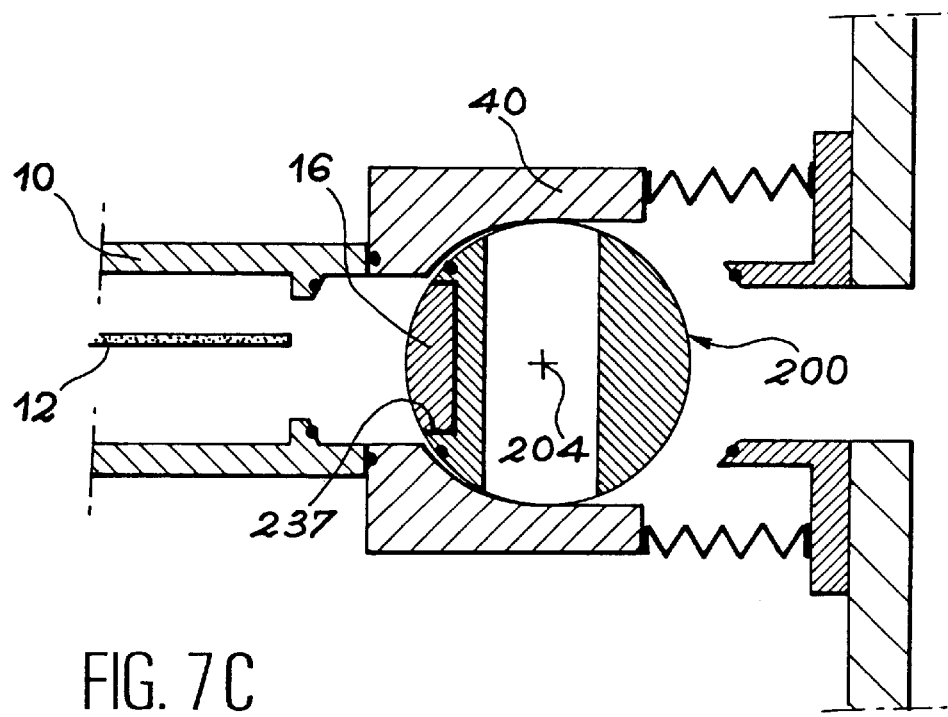
Figure 7D:
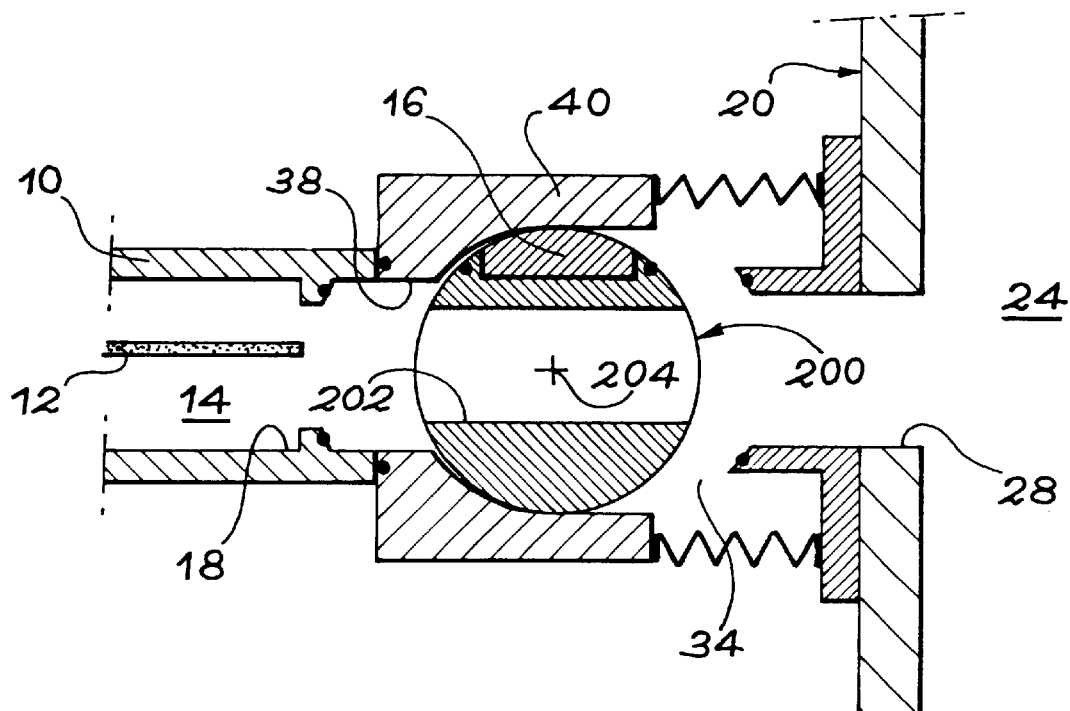

In a stage corresponding to FIG. 7C, door 16 of box 10 which initially blocked opening 18, is moved against part 236a of cylinder 200. Door 16 fits into a recess 237 of cylindrical part 236a where it is locked in position.

Motor means, not shown in the figures, then cause cylinder 200 to pivot one quarter of a turn so that slit 202 is substantially aligned with openings 18 and 28 of confinement box 10 and processing unit 20.

As is shown in FIG. 7C, opening 38 of coupling part 40 is then released and inner volumes 14, 24, 34 of box 10, processing unit 20 and the coupling means open into one another. The transfer of the flat object can then take place in the manner described previously.

FIG. 8 is a perspective view of coupling means 30. It gives the essential elements of the coupling means already described, such as base support 42, mouth part 40, bellows 44 and sealing rim 16 fitting with a seal 47.

Seal-ring 47 is placed around opening 38 which has an elongated shape compatible with that of the flat object not shown.

Two support arms 310 and 312 rise perpendicularly from base support 42 parallel to direction X of the movement of the mouth part from its retracted to its opened position.

Each arm is fitted at its end with a grasping mechanism 314 to grasp a confinement box in front of the mouth part. Said mechanism 314 is described in more detail below.

The arms and grasping mechanisms have a twofold function. One first function is to ensure precise positioning of the confinement box in front of the mouth part. A second function is to hold the confinement box firmly when sealing rim 46 is pressed against it.

Jacks 313, fixed either side of mouth part 40, are also connected to base support 42. These jacks allow mouth part 40 to be moved between its retracted position and its opened position in direction X. Finally, it will be noted that the path taken by the mouth part in direction X is guided by arms 310 and 312. Arms 310 and 312 may, for this purpose, carry guides 315.

The pivoting mechanism of shutter 36 is outlined in FIG. 4.

FIGS. 9A and 9B showed in detail a mechanism of the transfer system which pushes door 16 of confinement box 10 against shutter 36 and locks these parts together. A similar mechanism may be used to lock door 16 against shutters 36a or 236a in the embodiments of FIGS. 2A to 2D and 7A to 7D.

FIG. 9A also shows a particular embodiment of the mechanism with which door 16 can be moved into housing 37, door 16 can be associated with shutter 36, door 16 can be released, and finally shutter 36 and door 16 can be pivoted from a blocking position to a position freeing the passageway for the confinement box towards the processing unit.

FIG. 9A shows details of grasping mechanism 314.

Mechanism 314 comprises a stud 316 integral with tray 318 that is mobile between a retracted position in which the stud is drawn away from confinement box 10, and a forward position in which the stud locks into hole 320 of box 10. Tray 318 is actuated by a jack, not shown.

Also, a mobile actuator 322 with a fork also called a fork 322 is positioned in a slit made in stud 316. Fork 322 may be moved parallel to confinement box, that is to say parallel to the direction of transfer by means of a rack 324. The fork is used to actuate mechanism 400 described below.

When a confinement box is placed in front of the coupling system, tray 318 is moved towards the confinement box in direction Y shown in FIG. 9A. Stud 316 and fork 322 are therefore moved simultaneously to lock respectively into hole 320 and into imprints provided for the fork prongs on mechanism 400.

Stud 316, when it locks into hole 320, enables box 10 to be positioned precisely. Fork 322 can then be moved in direction X shown in FIG. 9A to actuate mechanism 400.

Mechanism 400 is used in particular to move door 16 of the confinement box against shutter 36 of the coupling means, to lock these two parts one on the other, and to release door 16 to allow pivoting. This mechanism is positioned in the confinement box, either side of its opening to face grasping mechanisms 314.

Mechanism 400 comprises a small connecting rod 402 whose first end 404, facing opening 18 of confinement box 10, is fitted with a part 406 forming a key.

Part 406 occupies a first angular position in which it is supported on the outside by door 16; a return spring 408, which acts on small connecting rod 402, enables door 16 to be drawn against the confinement box. A seal ring 410 of door 16 is therefore pressed into a corresponding groove 412 on box 10. Return spring 408 acts on small connecting rod 402 via a sleeve 414 in which slides a second end 416 of small connecting rod 402, and via a pawn 418 integral with sleeve 414 which is supported by a cam 420 of small connecting rod 402.

The above-described position in which spring 408 returns doors 16 against box 10 corresponds to a rest position of the mechanism.

This position is occupied when box 10 is not grasped by grasping mechanisms 314 or when mechanism 400 is not actuated by fork 322.

To move door 16 forwards against shutter 36, fork 322 is actuated, held in sleeve 414, so that it can be moved towards mouth part 40.

Fork 322 moves sleeve 414, and by so doing moves small connecting rod 402 towards the mouth part.

When a buttress 422 at the first end of the rod comes to press against one side of door 16 facing the inside of confinement box 10, door 16 is also moved so that it comes into contact with a counter door 424 of shutter 36.

Part 406 forming a key comes to house itself in imprint 430 made in head 431 of a bolt 432 integral with the counter-door.

When small connecting rod 402, actuated by fork 32, continues to move forwards, door 16 pushes counter-door 424 against the body 426 of shutter 36, opposing the action of a spring 428. This spring 428 initially holds counter-door 424 away from body 426 of the shutter.

When the counter-door comes to a stop against body 426 of shutter 36, small connecting rod 402 can no longer move forwards. The movement of fork 322 in direction of the mouth part then causes sleeve 414 to move forwards in the same direction, against return spring 434 and spring 408. The forward movement of sleeve 414 causes pawn 418 to move inside cam 420 imparting a rotation movement to small connecting rod 402.

Via key 406 and bolt head 431, the rotation movement is transmitted to a rod 436 of bolt 432 mounted so that it is free to rotate on door 16. A pin 438 located at the end of rod 436 then comes to position itself at the top of cam 440 to lock the counter-door on body 426 of shutter 36.

At the same time, a hook 442 integral with bolt head 431 comes to lock itself in a notch 444 of door 16.

Door 16 is then locked on counter-door 424 which is itself locked on body 426 of the shutter.

After locking, fork 322 is again moved towards its initial position shown as a continuous line in FIG. 9A. During this movement, key 406 is withdrawn from imprint 430. Also, further to the rotation movement of small connecting rod 402, key 406 occupies a second angular position, staggered by 90° for example, in which it does not rest on door 16. Therefore the movement of fork 322 enables small connecting rod 402 to be withdrawn from bolt 432 and door 16.

The unit formed by door 16, counter-door 424 and body 426 of the shutter may then be pivoted to release together both opening 18 of the confinement box and opening 38 of the mouth part. This operation corresponds to FIG. 1C already described.

Some references concerning the locking system are only given in FIG. 9B which is an enlarged view of one detail of FIG. 9A.

Although their lay-out differs slightly, the embodiment of FIG. 5A also contains the elements of the pivoting mechanism of shutter 36.

FIG. 9A shows, in particular, arm 102 connected to the shutter, pivot 104 which passes across the wall of mouth part 40 along axis 106, arm 108 located outside mouth part 40, and the actuating jack 110 that is joined to mouth part 40.

An identical mechanism to that of FIG. 9A exists on the side of the confinement box facing support arm 312. The mechanisms located either side of the confinement box are actuated simultaneously to ensure the movement of door 16 and the locking and unlocking of door 16 with shutter 36.

The preceding description relates to a transfer system with single coupling means. However, as shown in FIG. 10, it may comprise a multiplicity of said means for the simultaneous transfer of several flat objects towards the processing unit.

According to one embodiment in accordance with FIG. 10, the transfer system is equipped with a support tray 500 which can take a set of stacked confinement boxes 10. Each confinement box contains one single flat object 12 in this example. The tray is fitted with motor means, not shown, so that it can be moved in vertical direction, that is to say perpendicular to the direction of transfer of the flat objects. Therefore, the confinement boxes of the stack may successively be placed in position in front of one or more coupling means 30 in order to proceed with the transfer of a flat object, either from the confinement boxes towards the processing unit, or from the processing unit towards the confinement boxes.

Advantageously, the tray may be equipped with an optical indexing system to guarantee precise positioning of the confinement boxes in front of the coupling means.

Finally, through the coupling system, it is possible to maintain permanently a clean, pure atmosphere around the objects to be processed.

In the described embodiment, part of the equipment of the coupling system is fixed to the processing unit (coupling means) and part of the equipment is positioned in each confinement box (door and locking system). However, the coupling system of the invention is not incompatible with the use of conventional means for supplying processing units such as baskets of silicon wafers for example.

When the mouth part is in its previously described retracted position, a transfer of flat objects, in this case silicon wafers, may take place directly by placing the shutter in its open position.

Tray 500 may then be loaded with an ordinary rack of silicon wafers or tiered basket. Needless to say, in this case it is not possible to benefit from the advantages particular to the transfer system of the invention.

Documents Cited in the Disclosure:

(1)
  EP-A-0 582 016
(2)
  EP-A60 582 018
(3)
  FR-A-2 697 000
(4)
  EP-A-0 589 812
(5)
  GB-A-2 249 145.

What is claimed is:

1. In an apparatus for transferring a flat object arranged in a desired atmosphere in a confinement box to a processing apparatus for said object without substantially changing said atmosphere, said box having at least one wall with a first shutter mounted therein and said processing apparatus having at least a one wall with an opening therein, a coupling system comprising:

a coupling member having at least two facing side walls, one of said side walls having a second shutter adapted to face said first shutter of said confinement box and said other side wall having a third shutter;

mounting means for movably mounting said coupling member on said processing apparatus so that said third shutter closes said opening and maintains the atmosphere of said processing apparatus without change;

means for moving said one of said side walls of said coupling member into contact with said one wall of said confinement box;

interlocking means mounted on said first and second shutters so that said first and second shutter can be moved as a single unit without changing the atmosphere of said box or coupling member when said coupling member and said confinement box are in contact; and means for moving said interlocked first and second shutters and said third shutter simultaneously to permit transfer of said object from said confinement box through said coupling member into said processing apparatus without changing said desired atmosphere.

2. Coupling system in accordance with claim 1 wherein said coupling member has a base support (42) fixed to said processing apparatus (20) and surrounding said opening (28) of said processing apparatus (20), a mouth part (40), a sealed connector (44) connecting said mouth part (40) to said base support (42), and said moving means moves said mouth part between a retracted position, allowing box (10) to be placed in front of said coupling member (30), and an opened position in which said mouth part (40) is applied in sealed manner against said confinement box (10).

3. Coupling system in accordance with claim 1, wherein the base support (42) further comprises flanges (310, 312), for grasping the confinement box placed on either side of the mouth part.

4. Coupling system in accordance with claim 3, wherein the flanges (310, 312) carry guides (315) to guide said mouth part (40) to and from said mouth part.

5. Coupling system in accordance with claim 1 wherein said coupling means has a sealing rim (46) and wherein said confinement box (10) has a support band (48) surrounding the first shutter.

6. Coupling system in accordance with claim 1 wherein said coupling member has at least one housing (50, 50*a*) to receive said first, second and third shutters (16, 36, 36*b*).

7. Coupling system in accordance with claim 1, further comprising means for releasing the first, second and third shutters, wherein said means comprise a pivoting mechanism connected to the second and third shutters to cause the first shutter (16), the second shutter (36) and the third shutter (36*b*) of the confinement box to pivot between a blocking position and an opening position.

8. Coupling system in accordance with claim 1 wherein said interlocking means further comprises at least one bayonet device (502, 504) having locking parts of complementary shape placed respectively on the first (36) and second (36*a*) shutters.

9. Coupling system in accordance with claim 1 wherein said interlocking means include a rotatable key element in said second shutter.

10. Coupling system in accordance with claim 9, in which the first shutter (16) also comprises second locking/unlocking means (508, 510) to make the first shutter integral with the confinement box (10), the second locking/unlocking means being actuated by said key element (530) of the second shutter.

11. Coupling system in accordance with claim 10, in which the second locking/unlocking means comprise a cotter-pin (508) actuated by said key element (530) and comprising a wedge (520) to hold the cotter-pin in locking position when the key element part is withdrawn.

12. Coupling system in accordance with claim 9, further comprising means (536, 546, 548) causing said key element (530) to rotate, while coupling the confinement box (10) to the coupling member.

13. Coupling system in accordance with claim 12, in which the means causing said key element to rotate comprises a cam (548) and a sliding finger (536) supported on said confinement box (10), said finger having a pawl (518) engaged in a cam (548) to turn said key element (530) when the finger slides.

14. Coupling system in accordance with claim 1 wherein said moving means comprises rotatively mounted connecting rods (600) to cause the second and third shutters (36a, 36b) to pivot between a substantially horizontal position in which the second and third shutters are positioned substantially parallel to the opening of the processing apparatus, and a transfer position in which the second and third shutters are positioned substantially perpendicular to the opening of the processing apparatus.

15. Coupling system in accordance with claim 14, wherein said coupling member includes housings (50a, 50b) to house the second and third shutters when they occupy the transfer position.

16. Coupling system in accordance with claim 1, wherein the third shutter (36b) is a door, and has a sealing rim (64) surrounding the opening (28) of said processing apparatus.

17. Coupling system in accordance with claim 1, further comprising a support tray (500) able to support a stack of confinement boxes (10) and means for moving said tray, so that it can position confinement boxes successively in front of said coupling member(30).

18. Coupling system in accordance with claim 1, further comprising a mechanism (316, 318, 322) for holding the confinement box (10) during coupling.

* * * * *